(12) United States Patent
Huh et al.

(10) Patent No.: US 8,932,493 B2
(45) Date of Patent: Jan. 13, 2015

(54) CONDUCTIVE POLYMER, CONDUCTIVE POLYMER COMPOSITION, CONDUCTIVE POLYMER ORGANIC FILM, AND ORGANIC PHOTOELECTRIC DEVICE INCLUDING THE SAME

(75) Inventors: Dal-Ho Huh, Uiwang-si (KR); Jeong-Woo Lee, Uiwang-si (KR); Soo-Hyun Min, Uiwang-si (KR); Mi-Young Chae, Uiwang-si (KR); Tae-Woo Lee, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 789 days.

(21) Appl. No.: 13/169,492

(22) Filed: Jun. 27, 2011

(65) Prior Publication Data
US 2011/0253946 A1 Oct. 20, 2011

Related U.S. Application Data

(63) Continuation of application No. PCT/KR2009/007284, filed on Dec. 7, 2009.

(30) Foreign Application Priority Data

Dec. 26, 2008 (KR) .................. 10-2008-0134784

(51) Int. Cl.
 *H01B 1/00* (2006.01)
 (Continued)

(52) U.S. Cl.
 CPC ............. *H01B 1/124* (2013.01); *C08G 61/10* (2013.01); *C08G 61/124* (2013.01);
 (Continued)

(58) Field of Classification Search
None
See application file for complete search history.

(56) References Cited

U.S. PATENT DOCUMENTS
4,539,507 A 9/1985 VanSlyke et al.
(Continued)

FOREIGN PATENT DOCUMENTS

CN 1880377 A 12/2006
CN 101020818 A 8/2007
(Continued)

OTHER PUBLICATIONS

Search Report mailed in corresponding Chinese Patent Application No. 200980151268.2 Dec. 17, 2013.
(Continued)

*Primary Examiner* — Harold Pyon
*Assistant Examiner* — Jaison Thomas
(74) *Attorney, Agent, or Firm* — Lee & Morse, P.C.

(57) ABSTRACT

A conductive polymer, a conductive polymer composition, a conductive polymer organic film, and an organic photoelectric device including the same, the conductive polymer including repeating units represented by the following Chemical Formula 1, repeating units represented by the following Chemical Formula 2, and repeating units represented by the following Chemical Formula 3:

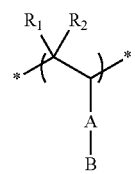

[Chemical Formula 1]

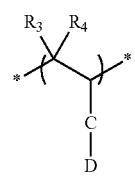

[Chemical Formula 2]

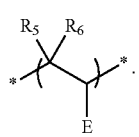

[Chemical Formula 3]

19 Claims, 2 Drawing Sheets

(51) Int. Cl.
*H01B 1/12* (2006.01)
*C08F 28/06* (2006.01)
*C08F 12/30* (2006.01)
*C08G 61/10* (2006.01)
*C08G 61/12* (2006.01)
*C08G 73/06* (2006.01)
*C08F 212/14* (2006.01)
*C08F 12/20* (2006.01)
*H01L 51/00* (2006.01)
*C08L 65/02* (2006.01)
*C08G 61/02* (2006.01)
*C08L 65/00* (2006.01)
*C08F 12/32* (2006.01)
*C08G 73/02* (2006.01)
*C08F 12/26* (2006.01)
*H01L 51/50* (2006.01)

(52) U.S. Cl.
CPC ....... *C08G 73/0672* (2013.01); *C08G 73/0611* (2013.01); *H01L 51/5092* (2013.01); *C08F 212/14* (2013.01); *C08F 12/20* (2013.01); *H01L 51/5088* (2013.01); *H01L 51/004* (2013.01); *C08L 65/02* (2013.01); *C08G 61/02* (2013.01); *H01L 51/0021* (2013.01); *C08L 65/00* (2013.01); *C08G 61/126* (2013.01); *C08F 12/32* (2013.01); *C08F 12/30* (2013.01); *C08G 73/0266* (2013.01); *C08F 12/26* (2013.01)
USPC ......... 252/500; 252/501.1; 526/256; 526/287

(56) References Cited

U.S. PATENT DOCUMENTS

| | | | |
|---|---|---|---|
| 4,720,432 | A | 1/1988 | VanSlyke et al. |
| 4,769,292 | A | 9/1988 | Tang et al. |
| 2005/0251597 | A1 | 11/2005 | Zhang |
| 2006/0175580 | A1 | 8/2006 | Jo et al. |
| 2006/0261332 | A1 | 11/2006 | Lee et al. |
| 2007/0176174 | A1 | 8/2007 | Lee et al. |
| 2007/0187675 | A1 | 8/2007 | Lee et al. |
| 2008/0234442 | A1 | 9/2008 | Huh et al. |

FOREIGN PATENT DOCUMENTS

| | | |
|---|---|---|
| CN | 101085857 A | 12/2007 |
| EP | 0 387 715 A2 | 9/1990 |
| JP | 2006-322003 A | 11/2006 |
| JP | 2008-038147 A | 2/2008 |
| JP | 2008-121014 A | 5/2008 |
| KR | 10-2006-0120378 A | 11/2006 |
| WO | WO 2005/010072 A1 | 2/2005 |
| WO | WO 2007/052878 A1 | 5/2007 |

OTHER PUBLICATIONS

Taiwanese Search Report in TW 098141704, dated Nov. 29, 2012 (Huh, et al.)
Huh, et al.; "A soluble self-doped conducting polyaniline graft copolymer as a hole injection layer in polymer light-emitting diodes;" Polymer, Oct. 5, 2007, pp. 7236-7240; 48, Elsevier, USA.
European Search Report in EP 098351984-1302/2370543, dated Oct. 21, 2013 (Huh, et al.).

CONDUCTIVE POLYMER, CONDUCTIVE POLYMER COMPOSITION, CONDUCTIVE POLYMER ORGANIC FILM, AND ORGANIC PHOTOELECTRIC DEVICE INCLUDING THE SAME

CROSS-REFERENCE TO RELATED APPLICATIONS

This application is a continuation of pending International Application No. PCT/KR2009/007284, entitled "Conductive Polymer, Polymer Composition, Film and Organic Photoelectric Device Including Same," which was filed on Dec. 7, 2009, the entire contents of which are hereby incorporated by reference.

BACKGROUND

1. Field

Embodiments relate to a conductive polymer, a conductive polymer composition, a conductive polymer organic film, and an organic photoelectric device including the same.

2. Description of the Related Art

A photoelectric device is a device for transforming photo-energy to electrical energy and, conversely, for transforming electrical energy to photo-energy. The photoelectric device may include, e.g., an organic light emitting diode, a solar cell, a transistor, and the like.

Among these photoelectric devices, the organic light emitting device employing organic light emitting diodes (OLED) has recently drawn attention due to the increase in demand for flat panel displays (FPD).

Recently, LCDs, which have been remarkably developed through technology, have had an increased market share of 80% or more in the FPD market. However, LCDs may have a slow response speed and a narrow viewing angle in a wide display of 40 inches or larger.

Thus, organic photoelectric devices have drawn attention as a display device for the next generation FPD because they may be driven at a low voltage, may be self-light-emitting, may be formed as a thin film, may have a wide viewing angle, high response speed, and high contrast, and may be economical to produce.

In the field of photoelectric devices (including the organic light emitting diode), researchers are studying the formation of a conductive polymer layer in order to improve efficiency of a photoelectric device by smoothly transferring charges generated in an electrode, e.g., holes and electrons, to the photoelectric device.

An organic light emitting diode is an active light emitting display device that takes advantage of a phenomenon in which electrons and holes are combined in an organic layer while emitting light when an electrical current flows to a fluorescent or phosphorescent organic compound thin film (hereinafter referred to as an organic layer).

The organic light emitting diode may not only use a single light emission layer as the organic layer, but rather may employ a multi-layer structure including a hole injection layer (HIL) (using a conductive polymer), a light emission layer, and an electron injection layer (EIL) to improve efficiency and decrease the driving voltage.

The multi-layer structure may be simplified by providing one layer that performs a plurality of functions. One of the simplest OLED structures is a structure where an organic layer performing all functions (including the function of a light emission layer) is interposed between two electrodes.

SUMMARY

Embodiments are directed to a conductive polymer, a conductive polymer composition, a conductive polymer organic film, and an organic photoelectric device including the same.

The embodiments may be realized by providing a conductive polymer comprising repeating units represented by the following Chemical Formula 1, repeating units represented by the following Chemical Formula 2, and repeating units represented by the following Chemical Formula 3:

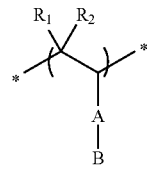

[Chemical Formula 1]

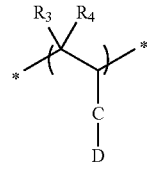

[Chemical Formula 2]

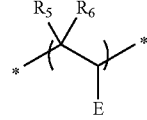

[Chemical Formula 3]

wherein in the above Chemical Formulae 1 to 3, $R_1$, $R_2$, $R_3$, $R_4$, $R_5$, and $R_6$ are each independently one of hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; a substituted or unsubstituted heteroarylester, and a halogen, A is one of a single bond; a substituted or unsubstituted alkylene; a substituted or unsubstituted heteroalkylene; a substituted or unsubstituted alkoxylene; a substituted or unsubstituted heteroalkoxylene; a substituted or unsubstituted arylene; a substituted or unsubstituted arylalkylene; a substituted or unsubstituted aryloxylene; a substituted or unsubstituted heteroarylene; a substituted or unsubstituted heteroarylalkylene; a substituted or unsubstituted heteroaryloxylene; a substituted or unsubstituted cycloalkylene; a substituted or unsubstituted heterocycloalkylene; a substituted or unsubstituted alkylene ester; a substituted or unsubstituted heteroalkylene ester; a substituted or unsubstituted arylene ester; and a substituted or unsubstituted heteroarylene ester, B is an ion-pair of a cation and an anion, the cation being selected from the group of $H^+$, a metal ion selected from the group of $Na^+$, $K^+$, $Li^+$, $Mg^{2+}$, $Zn^{2+}$, and $Al^{3+}$, $NR_3^+$ where R is H or a substituted or unsubstituted alkyl, and an organic ion of $CH_3(—CH_2—)_pO^+$ where p ranges from 1 to 50, and the anion being selected from the group of $PO_3^{2-}$, $SO_3^-$, $COO^-$, $I^-$, and $CH_3COO^-$, C is one of a single bond; —O—; —S—; —NH—; a substituted or unsubstituted alkylene; a substituted or unsubstituted heteroalkylene; a substituted or unsubstituted arylene; a substituted or unsubstituted oxyalkylene; a substituted or unsubstituted hetero-oxyalkylene; a substituted or unsubstituted arylalkylene; a substituted or unsubstituted aryloxylene; a substituted or unsubstituted aryleneamine; a substituted or unsubstituted pyrrolene; a substituted or unsubstituted thiophenylene; a substituted or unsubstituted heteroarylene; a substituted or unsubstituted heteroarylalkylene; a substituted or unsubstituted heteroaryloxylene; a substituted or unsubstituted cycloalkylene; a substituted or unsubstituted heterocycloalkylene; a substituted or unsubstituted alkylene ester; a substituted or unsubstituted heteroalkylene ester; a substituted or unsubstituted arylene ester; and a substituted or unsubstituted heteroarylene ester, D is one of a substituted or unsubstituted polyphenylene, a substituted or unsubstituted polyphenylenevinylene, a polyaniline or a derivative thereof represented by the following Chemical Formula 4, a polypyrrole or a derivative thereof represented by the following Chemical Formula 5, a substituted or unsubstituted polythiophene or a derivative thereof, and a polymer of a cyclic monomer represented by the following Chemical Formula 6, and E is a halogen-substituted carbon compound group that is unsubstituted or substituted with a heteroatom of nitrogen, phosphorus, sulfur, silicon, or oxygen, wherein a number average molecular weight Mn of the polyaniline or derivative thereof represented by the following Chemical Formula 4 is about 2,000 to about 100,000, and a weight average molecular weight Mw of the polyaniline or derivative thereof represented by the following Chemical Formula 4 is about 3,000 to about 200,000, a Mn of the polypyrrole or derivative thereof represented by the following Chemical Formula 5 is about 2,000 to about 100,000, and a Mw of the polypyrrole or a derivative thereof represented by the following Chemical Formula 5 is about 3,000 to about 200,000, and a Mn of the polymer of a cyclic monomer represented by the following Chemical Formula 6 is about 2,000 to about 100,000, and a Mw of the polymer of a cyclic monomer represented by the following Chemical Formula 6 is about 3,000 to about 200,000

[Chemical Formula 4]

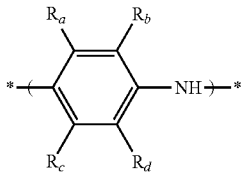

wherein in the above Chemical Formula 4, $R_a$, $R_b$, $R_c$, and $R_d$ are each independently one of hydrogen; a substituted or unsubstituted C1-C30 alkyl; a substituted or unsubstituted C1-C30 heteroalkyl; a substituted or unsubstituted C1-C30 alkoxy; a substituted or unsubstituted C1-C30 heteroalkoxy; a substituted or unsubstituted C6-C30 aryl; a substituted or unsubstituted C6-C30 arylalkyl; a substituted or unsubstituted C6-C30 aryloxy; a substituted or unsubstituted C6-C30 arylamine; a substituted or unsubstituted C6-C30 pyrrole; a substituted or unsubstituted C6-C30 thiophene; a substituted or unsubstituted C2-C30 heteroaryl; a substituted or unsubstituted C2-C30 heteroarylalkyl; a substituted or unsubstituted C2-C30 heteroaryloxy; a substituted or unsubstituted C5-C20 cycloalkyl; a substituted or unsubstituted C2-C30 heterocycloalkyl; a substituted or unsubstituted C2-C30 alkylester; a substituted or unsubstituted C1-C30 heteroalkylester; a substituted or unsubstituted C6-C30 arylester; and a substituted or unsubstituted C2-C30 heteroarylester,

[Chemical Formula 5]

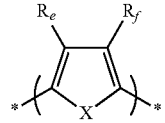

wherein in the above Chemical Formula 5, X is one of —NH—, —NR—; —PH, —PR—; —O—; and —S—, where R is a C1-C20 alkyl or a C6-C20 aryl, and $R_e$ and $R_f$ are each independently one of —$NH_2$, —NRR'; —$PH_2$, —PRR'; —OH, —OR; —SH, —SR, wherein R and R' are each independently hydrogen, a C1-C20 alkyl, or a C6-C20 aryl; a C1-C30 alkyl; a C6-C30 aryl; a C1-C30 alkoxy; a C1-C30 heteroalkyl; a C1-C30 heteroalkoxy; a C6-C30 arylalkyl; a C6-C30 aryloxy; a C6-C30 arylamine; a C6-C30 pyrrole; a C6-C30 thiophene; a C2-C30 heteroaryl; a C2-C30 heteroarylalkyl; a C2-C30 heteroaryloxy; a C5-C20 cycloalkyl; a C2-C30 heterocycloalkyl; a C2-C30 alkylester; a C1-C30 heteroalkylester; a C6-C30 arylester; a C2-C30 heteroarylester, or a combination thereof,

[Chemical Formula 6]

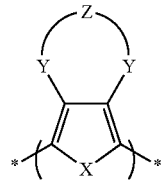

wherein in the above Chemical Formula 6, X and Y are each independently one of —NH—, —NR—; —PH—, —PR—; —O—; and —S—, where R is a C1-C20 alkyl or a C6-C20 aryl, Z is —$(CR_1R_2)_x$—$CR_3R_4$—$(CR_5R_6)_y$— wherein $R_1$ to $R_6$ are each independently one of —H, a C1-C20 alkyl, a C6-C14 aryl, and —$CH_2$—ORi wherein Ri is —H, a C1-C6 alkyl acid group, a C2-C6 alkylester group, a C1-C6 heteroalkyl acid group, or a C1-C6 alkylsulfonic acid group, x and y are each independently integers of 0 to 5, and in the above Chemical Formulae 4 to 6, one of the "*"is a portion bound with the C of Chemical Formula 2 and another "*" is —H or a substituted or unsubstituted C1-C30 alkyl.

$R_1$, $R_2$, $R_3$, $R_4$, $R_5$, and $R_6$ may each independently be one of a substituted or unsubstituted C1-C30 alkyl; a substituted or unsubstituted C1-C30 heteroalkyl; a substituted or unsubstituted C1-C30 alkoxy; a substituted or unsubstituted C1-C30 heteroalkoxy; a substituted or unsubstituted C6-C30 aryl; a substituted or unsubstituted C6-C30 arylalkyl; a substituted or unsubstituted C6-C30 aryloxy; a substituted or unsubstituted C2-C30 heteroaryl; a substituted or unsubstituted C2-C30 heteroarylalkyl; a substituted or unsubstituted C2-C30 heteroaryloxy; a substituted or unsubstituted C5-C20 cycloalkyl; a substituted or unsubstituted C2-C30 heterocycloalkyl; a substituted or unsubstituted C2-C30 alkylester; a substituted or unsubstituted C1-C30 heteroalkylester; a substituted or unsubstituted C6-C30 arylester; and a substituted or unsubstituted C2-C30 heteroarylester, A is one of a substituted or unsubstituted C1-C30 alkylene; a substituted or unsubstituted C1-C30 heteroalkylene; a substituted or unsubstituted C1-C30 alkoxylene; a substituted or unsubstituted C1-C30 heteroalkoxylene; a substituted or unsubstituted C6-C30 arylene; a substituted or unsubstituted C6-C30 arylalkylene; a substituted or unsubstituted C6-C30 aryloxylene; a substituted or unsubstituted C2-C30 heteroarylene; a substituted or unsubstituted C2-C30 heteroarylalkylene; a substituted or unsubstituted C2-C30 heteroaryloxylene; a substituted or unsubstituted C5-C20 cycloalkylene; a substituted or unsubstituted C2-C30 heterocycloalkylene; a substituted or unsubstituted C2-C30 alkylene ester; a substituted or unsubstituted C1-C30 heteroalkylene ester; a substituted or unsubstituted C6-C30 arylene ester; and a substituted or unsubstituted C2-C30 heteroarylene ester, and E is a halogen-substituted C2-C30 carbon compound group that is unsubstituted or substituted with a heteroatom of nitrogen, phosphorus, sulfur, silicon, or oxygen.

The embodiments may also be realized by providing a conductive polymer composition including a solvent; and a conductive polymer represented by the following Chemical Formula 12:

[Chemical Formula 12]

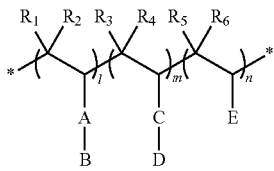

wherein in the above Chemical Formula 12, $R_1$, $R_2$, $R_3$, $R_4$, $R_5$, and $R_6$ are each independently one of hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; a substituted or unsubstituted heteroarylester, and a halogen, A is one of a single bond; a substituted or unsubstituted alkylene; a substituted or unsubstituted heteroalkylene; a substituted or unsubstituted alkoxylene; a substituted or unsubstituted heteroalkoxylene; a substituted or unsubstituted arylene; a substituted or unsubstituted arylalkylene; a substituted or unsubstituted aryloxylene; a substituted or unsubstituted heteroarylene; a substituted or unsubstituted heteroarylalkylene; a substituted or unsubstituted heteroaryloxylene; a substituted or unsubstituted cycloalkylene; a substituted or unsubstituted heterocycloalkylene; a substituted or unsubstituted alkylene ester; a substituted or unsubstituted heteroalkylene ester; a substituted or unsubstituted arylene ester; and a substituted or unsubstituted heteroarylene ester, B is an ion-pair of a cation and an anion, the cation being selected from the group of $H^+$, a metal ion selected from the group of $Na^+$, $K^+$, $Li^+$, $Mg^{2+}$, $Zn^{2+}$, and $Al^{3+}$, $NR_3^+$ where R is H or a substituted or unsubstituted alkyl, and an organic ion of $CH_3(-CH_2-)_pO^+$ where p ranges from 1 to 50, and the anion being selected from the group of $PO_3^{2-}$, $SO_3^-$, $Cl^-$, $I^-$, and $CH_3COO^-$, C is one of a single bond; —O—; —S—; —NH—; a substituted or unsubstituted alkylene; a substituted or unsubstituted heteroalkylene; a substituted or unsubstituted arylene; a substituted or unsubstituted oxyalkylene; a substituted or unsubstituted hetero-oxyalkylene; a substituted or unsubstituted arylalkylene; a substituted or unsubstituted aryloxylene; a substituted or unsubstituted aryleneamine; a substituted or unsubstituted pyrrolene; a substituted or unsubstituted thiophenylene; a substituted or unsubstituted heteroarylene; a substituted or unsubstituted heteroarylalkylene; a substituted or unsubstituted heteroaryloxylene; a substituted or unsubstituted cycloalkylene; a substituted or unsubstituted heterocycloalkylene; a substituted or unsubstituted alkylene ester; a substituted or unsubstituted heteroalkylene ester; a substituted or unsubstituted arylene ester; and a substituted or unsubstituted heteroarylene ester, D is one of a substituted or unsubstituted polyphenylene, a substituted or unsubstituted polyphenylenevinylene, a polyaniline or a derivative thereof represented by the following Chemical Formula 4, a polypyrrole or a derivative thereof represented by the following Chemical Formula 5, a substituted or unsubstituted polythiophene or a derivative thereof, and a polymer of a cyclic monomer represented by the following Chemical Formula 6, E is a halogen-substituted carbon compound group that is unsubstituted or substituted with a heteroatom of nitrogen, phosphorus, sulfur, silicon, or oxygen, and $5 \leq l \leq 1,000,000$, $0.0001 \leq m/l \leq 0.2$, $0.0001 \leq n/l \leq 1$, and $0.00000001 \leq m+n/l \leq 1.1$, a number average molecular weight Mn of the polyaniline or derivative thereof represented by the following Chemical Formula 4 is about 2,000 to about 100,000, and a weight average molecular weight Mw of the polyaniline or derivative thereof represented by the following Chemical Formula 4 is about 3,000 to about 200,000, a Mn of the polypyrrole or derivative thereof represented by the following Chemical Formula 5 is about 2,000 to about 100,000, and a Mw of the polypyrrole or a derivative thereof represented by the following Chemical Formula 5 is about 3,000 to about 200,000, and a Mn of the polymer of a cyclic monomer represented by the following Chemical Formula 6 is about 2,000 to about 100,000, and a Mw of the polymer of a cyclic monomer represented by the following Chemical Formula 6 is about 3,000 to about 200,000

[Chemical Formula 4]

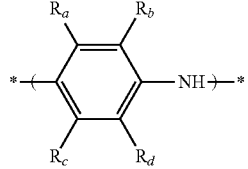

wherein in the above Chemical Formula 4, $R_a$, $R_b$, $R_c$, and $R_d$ are each independently one of hydrogen; a substituted or unsubstituted C1-C30 alkyl; a substituted or unsubstituted C1-C30 heteroalkyl; a substituted or unsubstituted C1-C30 alkoxy; a substituted or unsubstituted C1-C30 heteroalkoxy; a substituted or unsubstituted C6-C30 aryl; a substituted or unsubstituted C6-C30 arylalkyl; a substituted or unsubstituted C6-C30 aryloxy; a substituted or unsubstituted C6-C30 arylamine; a substituted or unsubstituted C6-C30 pyrrole; a substituted or unsubstituted C6-C30 thiophene; a substituted or unsubstituted C2-C30 heteroaryl; a substituted or unsubstituted C2-C30 heteroarylalkyl; a substituted or unsubstituted C2-C30 heteroaryloxy; a substituted or unsubstituted C5-C20 cycloalkyl; a substituted or unsubstituted C2-C30 heterocycloalkyl; a substituted or unsubstituted C2-C30 alkylester; a substituted or unsubstituted C1-C30 heteroalkylester; a substituted or unsubstituted C6-C30 arylester; and a substituted or unsubstituted C2-C30 heteroarylester,

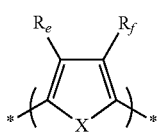

[Chemical Formula 5]

wherein in the above Chemical Formula 5, X is one of —NH—, —NR—; —PH, —PR—; —O—; and —S—, where R is a C1-C20 alkyl or a C6-C20 aryl, and $R_e$ and $R_f$ are each independently one of —NH$_2$, —NRR'; —PH$_2$, —PRR'; —OH, —OR; —SH, —SR, wherein R and R' are each independently hydrogen, a C1-C20 alkyl, or a C6-C20 aryl; a C1-C30 alkyl; a C6-C30 aryl; a C1-C30 alkoxy; a C1-C30 heteroalkyl; a C1-C30 heteroalkoxy; a C6-C30 arylalkyl; a C6-C30 aryloxy; a C6-C30 arylamine; a C6-C30 pyrrole; a C6-C30 thiophene; a C2-C30 heteroaryl; a C2-C30 heteroarylalkyl; a C2-C30 heteroaryloxy; a C5-C20 cycloalkyl; a C2-C30 heterocycloalkyl; a C2-C30 alkylester; a C1-C30 heteroalkylester; a C6-C30 arylester; a C2-C30 heteroarylester, or a combination thereof,

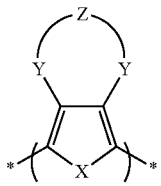

[Chemical Formula 6]

wherein in the above Chemical Formula 6, X and Y are each independently one of —NH—, —NR—; —PH—, —PR—; —O—; and —S—, where R is a C1-C20 alkyl or a C6-C20 aryl, Z is —(CR$_1$R$_2$)$_x$—CR$_3$R$_4$—(CR$_5$R$_6$)$_y$— wherein R$_1$ to R$_6$ are each independently one of —H, a C1-C20 alkyl, a C6-C14 aryl, and —CH$_2$—ORi wherein Ri is —H, a C1-C6 alkyl acid group, a C2-C6 alkylester group, a C1-C6 heteroalkyl acid group, or a C1-C6 alkylsulfonic acid group, x and y are each independently integers of 0 to 5, and in the above Chemical Formulae 4 to 6, one of the "*" is a portion bound with the C of Chemical Formula 2 and another "*" is —H or a substituted or unsubstituted C1-C30 alkyl.

R$_1$, R$_2$, R$_3$, R$_4$, R$_5$, and R$_6$ may each independently be one of a substituted or unsubstituted C1-C30 alkyl; a substituted or unsubstituted C1-C30 heteroalkyl; a substituted or unsubstituted C1-C30 alkoxy; a substituted or unsubstituted C1-C30 heteroalkoxy; a substituted or unsubstituted C6-C30 aryl; a substituted or unsubstituted C6-C30 arylalkyl; a substituted or unsubstituted C6-C30 aryloxy; a substituted or unsubstituted C2-C30 heteroaryl; a substituted or unsubstituted C2-C30 heteroarylalkyl; a substituted or unsubstituted C2-C30 heteroaryloxy; a substituted or unsubstituted C5-C20 cycloalkyl; a substituted or unsubstituted C2-C30 heterocycloalkyl; a substituted or unsubstituted C2-C30 alkylester; a substituted or unsubstituted C1-C30 heteroalkylester; a substituted or unsubstituted C6-C30 arylester; and a substituted or unsubstituted C2-C30 heteroarylester, A is one of a substituted or unsubstituted C1-C30 alkylene; a substituted or unsubstituted C1-C30 heteroalkylene; a substituted or unsubstituted C1-C30 alkoxylene; a substituted or unsubstituted C1-C30 heteroalkoxylene; a substituted or unsubstituted C6-C30 arylene; a substituted or unsubstituted C6-C30 arylalkylene; a substituted or unsubstituted C6-C30 aryloxylene; a substituted or unsubstituted C2-C30 heteroarylene; a substituted or unsubstituted C2-C30 heteroarylalkylene; a substituted or unsubstituted C2-C30 heteroaryloxylene; a substituted or unsubstituted C5-C20 cycloalkylene; a substituted or unsubstituted C2-C30 heterocycloalkylene; a substituted or unsubstituted C2-C30 alkylene ester; a substituted or unsubstituted C1-C30 heteroalkylene ester; a substituted or unsubstituted C6-C30 arylene ester; and a substituted or unsubstituted C2-C30 heteroarylene ester, and E is a halogen-substituted C2-C30 carbon compound group that is unsubstituted or substituted with a heteroatom of nitrogen, phosphorus, sulfur, silicon, or oxygen.

The conductive polymer may further include a repeating unit represented by at least one of the following Chemical Formulae 7 to 11:

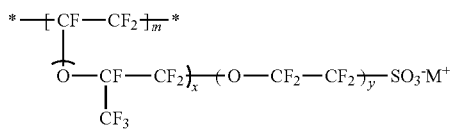

[Chemical Formula 7]

wherein in the above Chemical Formula 7, M$^+$ is one of H$^+$; an alkali metal cation; an alkaline-earth metal cation; and an ammonium ion, the ammonium ion including NH$^+$R$_1$R$_2$R$_3$, R$_1$ to R$_3$ are each independently one of hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; a substituted or unsubstituted heteroarylester; and a halogen, 0<m<1,000,000, and x and y are each independently integers of 0 to about 20,

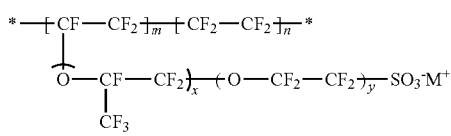

[Chemical Formula 8]

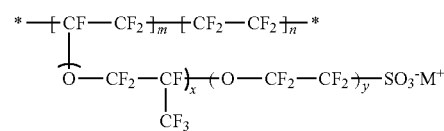

[Chemical Formula 9]

wherein in the above Chemical Formulae 8 and 9, M$^+$, m, x and y are the same as in the above Chemical Formula 7, and 0<n<1,000,000,

[Chemical Formula 10]

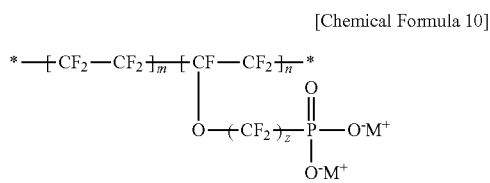

wherein in the above Chemical Formula 10, M⁺, m, and n are the same as in the above Chemical Formula 8, and z is an integer of 0 to about 20,

[Chemical Formula 11]

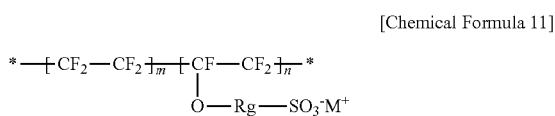

wherein in the above Chemical Formula 11, M⁺, m, n are the same as in the above Chemical Formula 8, and $R_g$ includes 1% or more of a fluorine substituent based on total hydrogen and includes one of a substituted or unsubstituted C1-C30 alkylene; a substituted or unsubstituted C1-C30 heteroalkylene; a substituted or unsubstituted C6-C30 arylene; a substituted or unsubstituted C6-C30 arylalkylene; a substituted or unsubstituted C2-C30 heteroarylene; a substituted or unsubstituted C2-C30 heteroarylalkylene; a substituted or unsubstituted C5-C20 cycloalkylene; and a substituted or unsubstituted C2-C30 heterocycloalkylene.

The solvent may include water, alcohol, dimethyl formamide (DMF), dimethylsulfoxide, toluene, xylene, chlorobenzene, or a combination thereof.

The conductive polymer composition may further include a cross-linking agent.

The cross-linking agent may include a hydroxyl-containing physical cross-linking agent, a hydroxyl-containing chemical cross-linking agent, or a mixture thereof.

The cross-linking agent may include the physical cross-linking agent, the physical cross-linking agent including glycerol, butanol, polyvinylalcohol, polyethyleneglycol, polyethyleneimine, polyvinylpyrrolidone, or a mixture thereof.

The physical cross-linking agent may be included in an amount of about 0.001 to about 5 parts by weight with respect to 100 parts by weight of the conductive polymer.

The cross-linking agent may include the chemical cross-linking agent, the chemical cross-linking agent including tetraethyloxysilane, polyaziridine, a melamine-based polymer, an epoxy-based polymer, or a combination thereof.

The chemical cross-linking agent may be included in an amount of about 0.001 to about 50 parts by weight, with respect to 100 parts by weight of the conductive polymer.

The conductive polymer composition may further include an organic salt.

The organic salt may include one of imidazolium salt, thiazolium salt, pyridinium salt, pyrrolidinium salt, and piperidinium salt.

The organic salt may be included in an amount of about 0.1 to about 10 parts by weight, with respect to 100 parts by weight of the conductive polymer.

The embodiments may also be realized by providing a conductive polymer organic film made using the conductive polymer composition of an embodiment.

The embodiments may also be realized by providing an organic photoelectric device including the conductive polymer organic film of an embodiment.

The organic photoelectric device may be an organic light emitting diode.

The conductive polymer organic film may be a hole or electron injection layer.

BRIEF DESCRIPTION OF THE DRAWINGS

The embodiments will become more apparent to those of ordinary skill in the art by describing in detail exemplary embodiments with reference to the attached drawings, in which.

DETAILED DESCRIPTION

Figure 1A:
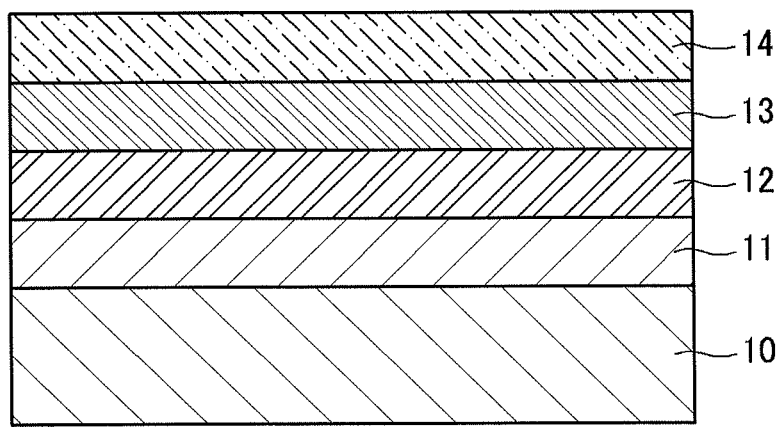
FIGS. 1A to 1D illustrate schematic cross-sectional views of organic light emitting diodes according to some embodiments.

Korean Patent Application No. 2008-330150, filed on Dec. 26, 2008, in the Korean Intellectual Property Office, and entitled: "Conductive Polymer, Polymer Composition, Film and Organic Photoelectric Device Including Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, when specific definition is not provided, the term "alkyl" may refer to a C1-C30 alkyl, the term "heteroalkyl" may refer to a C1-C30 heteroalkyl, the term "alkoxy" may refer to a C1-C30 alkoxy, the term "heteroalkoxy" may refer to a C1-C30 heteroalkoxy, the term "aryl" may refer to a C6-C30 aryl, the term "arylalkyl" may refer to a C6-C30 arylalkyl, the term "aryloxy" may refer to a C6-C30 aryloxy, the term "a heteroaryl" may refer to a C2-C30 heteroaryl, the term "heteroarylalkyl" may refer to a C2-C30 heteroarylalkyl, the term "heteroaryloxy" may refer to a C2-C30 heteroaryloxy, the term "cycloalkyl" may refer to a C5-C20 cycloalkyl, the term "heterocycloalkyl" may refer to a C2-C30 heterocycloalkyl, the term "alkylester" may refer to a C2-C30 alkylester, the term "heteroalkylester" may refer to a C1-C30 heteroalkylester, the term "arylester" may refer to a C6-C30 arylester, the term "alkylene" may refer to a C1-C30 alkylene, the term "heteroalkylene" may refer to a C1-C30 heteroalkylene, the term "alkoxylene" may refer to a C1-C30 alkoxylene, the term "heteroalkoxylene" may refer to a C1-C30 heteroalkoxylene, the term "arylene" may refer to a C6-C30 arylene, the term "arylalkylene" may refer to a C6-C30 arylalkylene, the term "aryloxylene" may refer to a C6-C30 aryloxylene, the term "heteroarylene" may refer to a C2-C30 heteroarylene, the term "heteroarylalkylene" may refer to a C2-C30 heteroarylalkylene, the term "heteroaryloxylene" may refer to a C2-C30 heteroaryloxylene, the term "cycloalkylene" may refer to a C5-C20 cycloalkylene, the term "heterocycloalkylene" may refer to a C2-C30 heterocycloalkylene, the term "alkylene ester" may refer to a C2-C30 alkylene ester, the term "heteroalkylene ester" may refer to a C1-C30 heteroalkylene ester, the term "arylene ester" may refer to a C6-C30 arylene ester, and the term "halogen" may refer to F, Cl, Br, or I.

As used herein, when specific definition is not provided, the term "substituted" may refer to one substituted with at least a substituent including a halogen (F, Cl, Br, or I), a hydroxy, a nitro, a cyano, an amino (—NH$_2$, —NH(R), or —N(R''')(R''''), where R, R''', and R'''' are independently a C1 to C10 alkyl), an amidino, a hydrazine, or a hydrazone, a carboxyl, a substituted or unsubstituted alkyl, a substituted or unsubstituted aryl, a substituted or unsubstituted cycloalkyl, a substituted or unsubstituted heteroaryl, or a substituted or unsubstituted heterocycloalkyl.

An alkyl may be a linear or branched alkyl, e.g., methyl, ethyl, propyl, isobutyl, sec-butyl, tert-butyl, pentyl, iso-amyl, hexyl, and the like.

A heteroalkyl may refer to an alkyl including at least one heteroatom, and preferably 1 to 5 heteroatoms, e.g., oxygen (O), sulfur (S), nitrogen (N), phosphorus (P), and the like, in its main chain instead of carbon.

An alkoxy may include methoxy, ethoxy, propyloxy, isobutyloxy, sec-butyloxy, pentyloxy, iso-amyloxy, hexyloxy, and the like.

An aryl may refer to carbocycle aromatic molecules including at least one of aromatic cycles, and the cycles may be bound as a pendent group or fused. Examples of the aryl may include aromatic groups such as phenyl, naphthyl, tetrahydronaphthyl, and the like.

An arylalkyl may refer to an aryl including a lower alkyl, for example C1 to C5 radicals such as methyl, ethyl, propyl, and the like. Specific examples of the arylalkyl may include benzylmethyl, phenylethyl, and the like.

An aryloxy may refer to an —O-aryl radical, where the aryl is the same as described above. Examples of the aryloxy may include phenoxy, naphthoxy, anthracenyloxy, phenanthrenyloxy, fluorenyloxy, indenyloxy, and the like, and at least one hydrogen atom of the aryloxy may be substituted with an alkyl.

A heteroaryl may refer to C5 to C30 cyclic aromatic compounds including 1 to 3 heteroatoms selected from the group consisting of N, O, P, and S, with the remaining being carbon atoms. The cycles or rings may be bound as a pendent group or fused.

A heteroarylalkyl may refer to a heteroaryl including a lower alkyl, and the heteroaryl of the heteroarylalkyl is the same as above-described.

A heteroaryloxy may refer to an —O-heteroaryl radical where the heteroaryl is the same as above-described.

A cycloalkyl may refer to a C5 to C30 monovalent monocyclic system.

A heterocycloalkyl may refer to a C5 to C30 monovalent monocyclic compound that is a cycloalkyl including 1 to 3 heteroatoms selected from N, O, P, or S.

A heteroalkoxy may refer to a carbon compound where one side of —O— is connected to 1 to 3 heteroatoms selected from N, O, P, or S.

An alkylester may refer to a —COO— alkyl radical where the alkyl is the same as above-described.

A heteroalkylester may refer to a —COO— heteroalkyl radical where the heteroalkyl is the same as above-described.

An arylester and heteroarylester may refer to —COO— aryl or heteroaryl radicals, and the aryl and heteroaryl are the same as above-described.

The embodiments relate to a conductive polymer, e.g., to a conductive polymer that may not be dedoped by heat because the conductive polymer may be chemically bound and self-doped.

The conductive polymer according to an embodiment may include repeating units represented by the following Chemical Formula 1, repeating units represented by the following Chemical Formula 2, and repeating units represented by the following Chemical Formula 3.

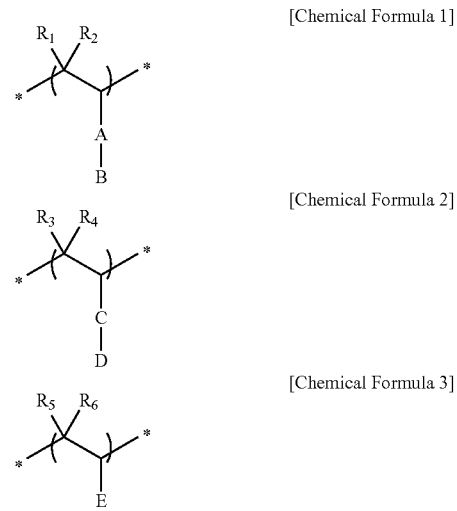

In the above Chemical Formulae 1 to 3, $R_1$, $R_2$, $R_3$, $R_4$, $R_5$, and $R_6$ may each independently be one of hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; a substituted or unsubstituted heteroarylester; and a halogen (e.g., F, Br, Cl, or I), A may be one of a single bond; a substituted or unsubstituted alkylene; a substituted or unsubstituted heteroalkylene; a substituted or unsubstituted alkoxylene; a substituted or unsubstituted heteroalkoxylene; a substituted or unsubstituted arylene; a substituted or unsubstituted arylalkylene; a substituted or unsubstituted aryloxylene; a substituted or unsubstituted heteroarylene; a substituted or unsubstituted heteroarylalkylene; a substituted or unsubstituted heteroaryloxylene; a substituted or unsubstituted cycloalkylene; a substituted or unsubstituted heterocycloalkylene; a substituted or unsubstituted alkylene ester; a substituted or unsubstituted heteroalkylene ester; a substituted or unsubstituted arylene ester; and a substituted or unsubstituted heteroarylene ester, B may be an ion-pair of a cation and an anion, where the cation is one of H$^+$, a metal ion (including one of Na$^+$, K$^+$, Li$^+$, $Mg^{2+}$, $Zn^{2+}$, and $Al^{3+}$, $NR_3{}^+$ where R is H or a substituted or unsubstituted alkyl), and an organic ion of $CH_3(-CH_2-)_pO^+$ where p is 1 to about 50, and the anion may be one of $PO_3{}^{2-}$, $SO_3{}^-$, $COO^-$, F, and $CH_3COO^-$, C may be one of a single bond; —O—; —S—; —NH—; a substituted or unsubstituted alkylene; a substituted or unsubstituted heteroalkylene; a substituted or unsubstituted arylene; a substituted or unsubstituted oxyalkylene; a substituted or unsubstituted hetero-oxyalkylene; a substituted or unsubstituted arylalkylene; a substituted or unsubstituted aryloxylene; a substituted or unsubstituted aryleneamine; a substituted or unsubstituted pyrrolene; a substituted or unsubstituted thiophenylene; a substituted or unsubstituted heteroarylene; a substituted or unsubstituted heteroarylalkylene; a substituted or unsubstituted heteroaryloxylene; a substituted or unsubstituted cycloalkylene; a substituted or unsubstituted heterocycloalkylene; a substituted or unsubstituted alkylene ester; a substituted or unsubstituted heteroalkylene ester; a substituted or unsubstituted arylene ester; and a substituted or unsubstituted heteroarylene ester, D may be one of a substituted or unsubstituted polyphenylene, a substituted or unsubstituted polyphenylenevinylene, a polyaniline or a derivative thereof represented by the following Chemical Formula 4, a polypyrrole or a derivative thereof represented by the following Chemical Formula 5, a substituted or unsubstituted polythiophene or a derivative thereof, and a polymer of a cyclic monomer represented by the following Chemical Formula 6, and E may be a halogen-substituted carbon compound group that is unsubstituted or substituted with a heteroatom of nitrogen, phosphorus, sulfur, silicon, oxygen, and the like.

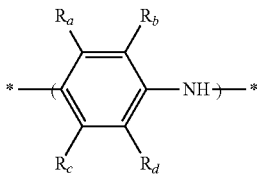

[Chemical Formula 4]

In the above Chemical Formula 4, $R_a$, $R_b$, $R_c$, and $R_d$ may each independently be one of hydrogen; a substituted or unsubstituted C1-C30 alkyl; a substituted or unsubstituted C1-C30 heteroalkyl; a substituted or unsubstituted C1-C30 alkoxy; a substituted or unsubstituted C1-C30 heteroalkoxy; a substituted or unsubstituted C6-C30 aryl; a substituted or unsubstituted C6-C30 arylalkyl; a substituted or unsubstituted C6-C30 aryloxy; a substituted or unsubstituted C6-C30 arylamine; a substituted or unsubstituted C6-C30 pyrrole; a substituted or unsubstituted C6-C30 thiophene; a substituted or unsubstituted C2-C30 heteroaryl; a substituted or unsubstituted C2-C30 heteroarylalkyl; a substituted or unsubstituted C2-C30 heteroaryloxy; a substituted or unsubstituted C5-C20 cycloalkyl; a substituted or unsubstituted C2-C30 heterocycloalkyl; a substituted or unsubstituted C2-C30 alkylester; a substituted or unsubstituted C1-C30 heteroalkylester; a substituted or unsubstituted C6-C30 arylester; and a substituted or unsubstituted C2-C30 heteroarylester.

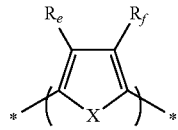

[Chemical Formula 5]

In the above Chemical Formula 5,

X may be one of —NH—, —NR—; —PH, —PR—; —O—; and —S— where R is a C1-C20 alkyl or a C6-C20 aryl, and $R_e$ and $R_f$ may each independently be one of —$NH_2$, —NRR'; —$PH_2$, —PRR'; —OH, —OR; —SH, and —SR, where R and R' are each independently hydrogen, a C1-C20 alkyl, or a C6-C20 aryl; a C1-C30 alkyl; a C6-C30 aryl; a C1-C30 alkoxy; a C1-C30 heteroalkyl; a C1-C30 heteroalkoxy; a C6-C30 arylalkyl; a C6-C30 aryloxy; a C6-C30 arylamine; a C6-C30 pyrrole; a C6-C30 thiophene; a C2-C30 heteroaryl; a C2-C30 heteroarylalkyl; a C2-C30 heteroaryloxy; a C5-C20 cycloalkyl; a C2-C30 heterocycloalkyl; a C2-C30 alkylester; a C1-C30 heteroalkylester; a C6-C30 arylester; a C2-C30 heteroarylester; or a combination thereof.

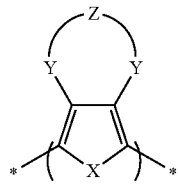

[Chemical Formula 6]

In the above Chemical Formula 6,

X and Y may each independently be one of —NH—, —NR—; —PH—, —PR—; —O—; and —S—, where R is a C1-C20 alkyl or a C6-C20 aryl, Z may be —$(CR_1R_2)_x$—$CR_3R_4$—$(CR_5R_6)_y$, where $R_1$ to $R_6$ are each independently one of —H, a C1-C20 alkyl radical, a C6-C14 aryl radical, and —$CH_2$—ORi where Ri is —H, a C1-C6 alkyl acid group, a C2-C6 alkylester group, a C1-C6 heteroalkyl acid group, or a C1-C6 alkylsulfonic acid group, and x and y may each independently be integers of 0 to 5. In the above Chemical Formulae 4 to 6, one of the "*"may be a portion bound with the C of Chemical Formula 2 and another "*" may be —H or a substituted or unsubstituted C1-C30 alkyl. In the case that Chemical Formula 4 is bound to 'C' of Chemical Formula 2, one of the "*" of Chemical Formula 2 may be a portion bound with the C of Chemical Formula 2 and another "*" may be —H or a substituted or unsubstituted C1-C30 alkyl. In the case that Chemical Formula 5 is bound to 'C' of Chemical Formula 2, one of the "*" may be a portion bound with the C of Chemical Formula 2 and another "*" may be —H or a substituted or unsubstituted C1-C30 alkyl. In the case that Chemical Formula 6 is bound to 'C' of Chemical Formula 2, one of the "*" may be a portion bound with the C of Chemical Formula 2 and another "*" may be —H or a substituted or unsubstituted C1-C30 alkyl.

The polyaniline or derivative thereof represented by Chemical Formula 4 may be a polymeric moiety in which Chemical Formula 4 repeats. A number average molecular weight Mn of the polyaniline or derivative thereof represented by Chemical Formula 4 may be about 2,000 to about 100,000, and a weight average molecular weight Mw of the polyaniline or derivative thereof represented by Chemical Formula 4 may be about 3,000 to about 200,000. The polypyrrole or derivative thereof represented by Chemical Formula 5 may be a polymeric moiety in which Chemical Formula 5 repeats. A Mn of the polypyrrole or derivative thereof represented by Chemical Formula 5 may be about 2,000 to about 100,000, and a Mw of the polypyrrole or a derivative thereof represented by Chemical Formula 5 may be about 3,000 to about 200,000. The polymer of a cyclic monomer represented by Chemical Formula 6 may be a polymeric moiety in which Chemical Formula 6 repeats. A Mn of the polymer of a cyclic monomer represented by Chemical Formula 6 may be about 2,000 to about 100,000, and a Mw of the polymer of a cyclic monomer represented by Chemical Formula 6 may be about 3,000 to about 200,000.

In Chemical Formulae 1 to 3, it is preferable that $R_1$, $R_2$, $R_3$, $R_4$, $R_5$, and $R_6$ are each independently one of a substituted or unsubstituted C1-C30 alkyl; a substituted or unsubstituted C1-C30 heteroalkyl; a substituted or unsubstituted C1-C30 alkoxy; a substituted or unsubstituted C1-C30 heteroalkoxy; a substituted or unsubstituted C6-C30 aryl; a substituted or unsubstituted C6-C30 arylalkyl; a substituted or unsubstituted C6-C30 aryloxy; a substituted or unsubstituted C2-C30 heteroaryl; a substituted or unsubstituted C2-C30 heteroarylalkyl; a substituted or unsubstituted C2-C30 heteroaryloxy; a substituted or unsubstituted C5-C20 cycloalkyl; a substituted or unsubstituted C2-C30 heterocycloalkyl; a substituted or unsubstituted C2-C30 alkylester; a substituted or unsubstituted C1-C30 heteroalkylester; a substituted or unsubstituted C6-C30 arylester; and a substituted or unsubstituted C2-C30 heteroarylester.

It is preferable that A is one of a substituted or unsubstituted C1-C30 alkylene; a substituted or unsubstituted C1-C30 heteroalkylene; a substituted or unsubstituted C1-C30 alkoxylene; a substituted or unsubstituted C1-C30 heteroalkoxylene; a substituted or unsubstituted C6-C30 arylene; a substituted or unsubstituted C6-C30 arylalkylene; a substituted or unsubstituted C6-C30 aryloxylene; a substituted or unsubstituted C2-C30 heteroarylene; a substituted or unsubstituted C2-C30 heteroarylalkylene; a substituted or unsubstituted C2-C30 heteroaryloxylene; a substituted or unsubstituted C5-C20 cycloalkylene; a substituted or unsubstituted C2-C30 heterocycloalkylene; a substituted or unsubstituted C2-C30 alkylene ester; a substituted or unsubstituted C1-C30 heteroalkylene ester; a substituted or unsubstituted C6-C30 arylene ester; and a substituted or unsubstituted C2-C30 heteroarylene ester.

It is preferable that E is a halogen-substituted C2-C30 carbon compound group that is unsubstituted or substituted with a heteroatom of nitrogen, phosphorus, sulfur, silicon, oxygen, and the like.

It is preferable that D is included in an amount of about 1 to about 50 wt %, based on a total amount of conductive polymer, and it is more preferable that it is included in an amount of about 1 to about 20 wt %. Maintaining the amount of D at about 1 to about 50 wt % may help ensure that it is possible to suppress aggregation of a conductive polymer, so as to prevent precipitation in a solvent. For example, when D is included in an amount of about 1 wt % or greater, it may provide conductivity capable of applying to the organic photoelectric device. In addition, maintaining the amount of D at about 1 wt % or greater may help prevent a deterioration in the hole injection characteristics due to sufficient conductivity. Accordingly, when D is included in an amount of about 1 to about 50 wt %, both suitable dispersion and suitable conductivity may be obtained.

The conductive polymer of an embodiment may increase electrochemical stability because the conductive polymer may be covalently bound with the doping polymer acid.

The conductive polymer may have a lesser amount of a residual group decomposed by a reaction with electrons, and may decrease the intermolecular aggregation. Thus, the organic photoelectric device including the conductive polymer may exhibit good storage stability, high efficiency, and a long life-span.

A conductive polymer composition according to an embodiment may include a solvent and a conductive polymer represented by the following Chemical Formula 12.

[Chemical Formula 12]

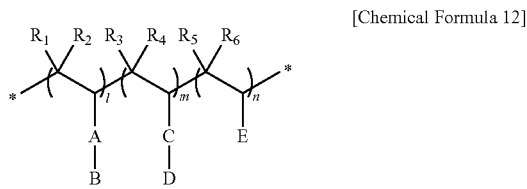

In the above Chemical Formula 12, $R_1$, $R_2$, $R_3$, $R_4$, $R_5$, $R_6$, A, B, C, D, and E are the same as in the above Chemical Formulae 1 to 3, and $5 \leq l \leq 1{,}000{,}000$, $0.0001 \leq m/l \leq 0.2$, $0.0001 \leq n/l \leq 1$, and $0.00000001 \leq m+n/l \leq 1.1$.

In an implementation, l, m, and n may satisfy the following relations: $5 \leq l \leq 1{,}000$, $0.01 \leq m/l \leq 0.2$, $0.01 \leq n/l \leq 1$, and $0.0001 \leq m+n/l \leq 0.8$.

The conductive polymer may further include a repeating unit represented by one of the following Chemical Formulae 7 to 11.

[Chemical Formula 7]

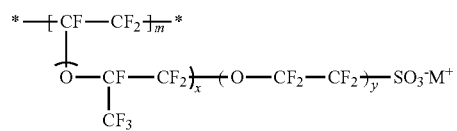

In the above Chemical Formula 7

$M^+$ may be one of $H^+$; an alkali metal cation; an alkaline-earth metal cation; and an ammonium ion ($NH_4^+$, $NH^+_2R_1R_2$, or $NH_+R_1R_2R_3$), $R_1$ to $R_3$ may each independently be one of hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; a substituted or unsubstituted heteroarylester; and a halogen. A fluorine (F)-substituted moiety is preferable.

$0 < m < 1{,}000{,}000$, and x and y may each independently be integers of 0 to 20.

[Chemical Formula 8]

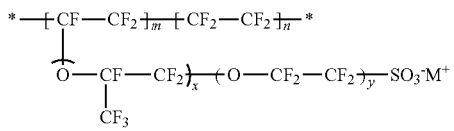

[Chemical Formula 9]

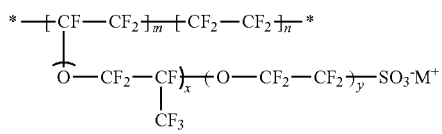

In the above Chemical Formulae 8 and 9,

M, m, x, and y are the same as in the above Chemical Formula 7, and $0<n<1{,}000{,}000$.

[Chemical Formula 10]

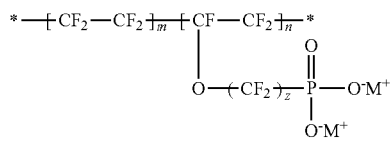

In the above Chemical Formula 10,

M, m, and n are the same as in the above Chemical Formula 8, and z may be an integer of 0 to about 20.

[Chemical Formula 11]

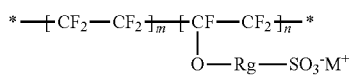

In the above Chemical Formula 11,

M, m, and n are the same as in the above Chemical Formula 8, $R_g$ may include about 1% or more of a fluorine substituent based on total hydrogen. For example, $R_g$ may include one of a substituted or unsubstituted C1-C30 alkylene; a substituted or unsubstituted C1-C30 heteroalkylene; a substituted or unsubstituted C6-C30 arylene; a substituted or unsubstituted C6-C30 arylalkylene; a substituted or unsubstituted C2-C30 heteroarylene; a substituted or unsubstituted C2-C30 heteroarylalkylene; a substituted or unsubstituted C5-C20 cycloalkylene; and a substituted or unsubstituted C2-C30 heterocycloalkylene.

As mentioned above, the compound represented by Chemical Formula 12 may be provided by polymerizing monomers corresponding to the repeating unit of Chemical Formula 1, Chemical Formula 2, and Chemical Formula 3. The C and D bond in Chemical Formula 4 may have a more thermally stable structure than in an case where the conductive polymer is simply doped.

In addition, a large amount of fluorine substituents may prevent aggregation of the ionomer as well as intermolecular agglomeration, so that surface roughness of the conductive polymer organic film may be decreased.

It is preferable that D is included in an amount of about 1 to about 50 wt %, based on a total amount of ionomer and conductive polymer, and it is more preferable that it is included in an amount of about 1 to about 20 wt %. When D is included in an amount of about 1 to about 50 wt % (based on the total amount of ionomer and conductive polymer), it is possible to prevent the aggregation of the conductive polymer composition, thereby preventing precipitation in a solvent. For example, when D is included in an amount of about 1 wt % or greater, it may provide conductivity capable of applying to the organic photoelectric device. Furthermore, when D is included in an amount of about 1 wt % or greater the hole injection characteristics and conductivity may be sufficiently maintained. Accordingly, when D is included in an amount of about 1 to about 50 wt %, it is possible to suitably provide both dispersion and conductivity.

Any suitable solvent that is capable of dissolving the conductive polymer may be used as a solvent for preparing the conductive polymer composition, e.g., water, alcohol, dimethyl formamide (DMF), dimethylsulfoxide, toluene, xylene, and chlorobenzene.

In the conductive polymer composition, a content of solid components (including a conductive polymer compound and/or a cross-linking agent) may be about 0.5 to about 30 wt %, and more preferably about 0.5 to about 10 wt %. Maintaining the content of the solid components within this range may help ensure an appropriate content of the solid component and thus the concentration of the composition may be appropriate as well. Thus, a thin film may be formed with a good shape, and this makes the process excellent.

The conductive polymer composition may further include a cross-linking agent to improve cross-linking performance of the conductive polymer.

The cross-linking agent may include, e.g., a hydroxyl-containing physical cross-linking agent, a hydroxyl-containing chemical cross-linking agent, or a combination thereof.

The physical cross-linking agent may be a material for physically cross-linking polymer chains without chemical coupling. The physical cross-linking agent may refer to a low-molecular weight or polymeric compound containing a hydroxyl group (—OH). Examples of the physical cross-linking agent may include low molecular weight compounds, e.g., glycerol and butanol, and polymeric compounds, e.g., polyvinyl alcohol and polyethyleneglycol. In an implementation, polyethyleneimine and polyvinylpyrrolidone may be used as the physical cross-linking agent.

The physical cross-linking agent may be included in an amount of about 0.001 to about 5 parts by weight, with respect to 100 parts by weight of the conductive polymer. In an implementation, the physical cross-linking agent may be included in an amount of about 0.1 to about 3 parts by weight. Maintaining the amount of the physical cross-linking agent within the range may help ensure that the cross-linking agent performs efficiently and that thin film morphology of the conductive polymer layer may be effectively maintained.

A chemical cross-linking agent is a material for chemically cross-linking polymer chains, is a chemical material that is available for in-situ polymerization, and is capable of forming an interpenetrating polymer network (IPN). The chemical cross-linking agent may include silane materials, e.g., tetraethyloxysilane (TEOS). In an implementation, polyaziridine, melamine materials, and epoxy materials may be used as the chemical cross-linking agent.

The chemical cross-linking agent may be included in an amount of about 0.001 to about 50 parts by weight, with respect to 100 parts by weight of a conductive polymer. In an implementation, the chemical cross-linking agent may be included in an amount of about 1 to about 10 parts by weight. Maintaining the amount of the chemical cross-linking agent within the range may help ensure that the cross-linking agent performs effectively and does not affect the conductive polymer to thereby maintain sufficient conductivity.

When a mixture of the physical cross-linking agent and the chemical cross-linking agent is used, the mixture may be prepared properly within the content ranges described above.

The conductive polymer composition may further include an organic salt.

The organic salt may facilitate transfer of electrons of the conductive polymer in a device to thereby improve current stability, life-span, and electrochemical stability. Examples of the organic salt may include imidazolium salt, thiazolium salt, pyridinium salt, pyrrolidinium salt, and piperidinium salt.

The organic salt may be included in the composition in an amount of about 0.001 to about 10 parts by weight, with respect to 100 parts by weight of a conductive polymer compound. In an implementation, the organic salt may be included in the composition in an amount of about 0.01 to about 3 parts by weight. Maintaining the amount of the organic salt at about 0.001 to about 10 parts by weight may help ensure that advantageous physical properties of the conductive polymer composition are not changed.

When the conductive polymer composition according to an embodiment is used for fabrication of an organic photoelectric device, the composition may be coated on a substrate. Then, most of the solvent may be removed; and the conductive polymer composition may remain as a conductive polymer organic film.

Another embodiment provides an organic photoelectric device including a conductive polymer organic film formed by using a conductive polymer composition. The photoelectric device may be include, e.g., organic light emitting diodes, organic solar cells, organic transistors, organic memory devices, and the like.

In an organic photoelectric device, the conductive polymer composition may be used to prepare a charge injection layer, e.g., a hole or electron injection layer (EIL). Light emitting intensity and efficiency of the organic photoelectric device may be increased by uniformly and efficiently injecting holes and electrons.

Also, in the case of an organic solar cell, the conductive polymer layer composition may be used to prepare an electrode or an electrode buffer layer to thereby increase quantum efficiency. In the case of an organic transistor, the conductive polymer layer composition may be be used to prepare an electrode material in a gate or source-drain electrode.

Hereinafter, the conductive polymer composition applied to an organic photoelectric device will be described.

Fabrication of an organic photoelectric device according to an embodiment may not require a specific apparatus or method, and the organic photoelectric device of the embodiments may be fabricated through a suitable organic photoelectric device fabrication method.

FIGS. 1A to 1D illustrate structures of organic photoelectric devices according to some embodiments.

The organic photoelectric device of FIG. 1A may include a light emission layer 12 above a first electrode 10, a hole injection layer (HIL) 11 (including the conductive polymer composition of an embodiment) between the first electrode 10 and the light emission layer 12, a hole blocking layer (HBL) 13 on the light emission layer 12, and a second electrode 14 on the hole blocking layer (HBL) 13. The hole injection layer (HIL) 11 may be referred to as a buffer layer.

Figure 1B:
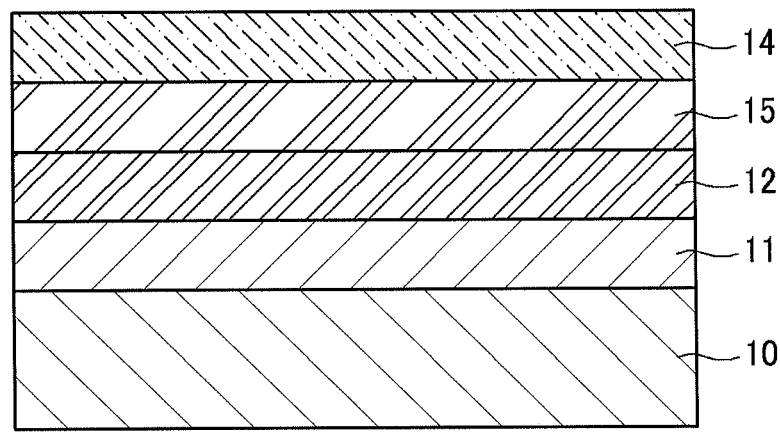

The organic photoelectric device of FIG. 1B may have the same stacking structure as that of FIG. 1A, except that an electron transport layer (ETL) 15 may be included instead of the hole blocking layer (HBL) 13 on the light emission layer 12.

Figure 1C:
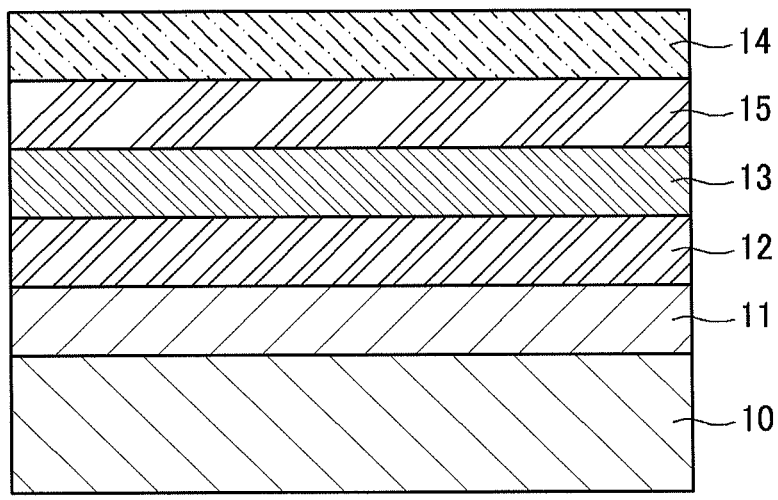

The organic photoelectric device of FIG. 1C may have the same stacking structure as that of FIG. 1A, except that a dual layer of the hole blocking layer (HBL) 13 and the electron transport layer (ETL) 15 sequentially stacked therein may be included on top of the light emission layer 12.

Figure 1D:
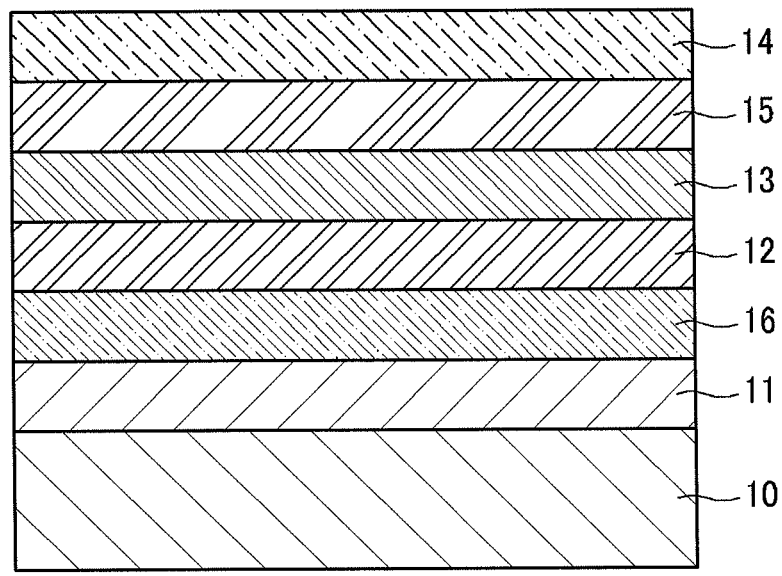

The organic photoelectric device of FIG. 1D may have the same structure as that of FIG. 1C, except that a hole transport layer (HTL) 16 may be included between the hole injection layer (HIL) 11 and the light emission layer 12. The hole transport layer (HTL) 16 may suppress permeation of impurities from the hole injection layer (HIL) 11 to the emission layer 12.

The organic photoelectric device having the stacking structure of FIGS. 1A to 1D may be fabricated through a general fabrication method.

For example, a patterned first electrode 10 may be formed on a substrate. The substrate may be a typical substrate for an organic photoelectric device, and may include, e.g., a glass substrate or a transparent plastic substrate having excellent general transparence, surface smoothness, handling ease, and water repellency. The substrate may have a thickness of about 0.3 to about 1.1 mm.

Materials for forming the first electrode 10 are not specifically limited. When the first electrode is a cathode, the cathode may be formed using conductive metals or oxides thereof that facilitate hole injection. Examples of the materials may include indium tin oxide (ITO), indium zinc oxide (IZO), nickel (Ni), platinum (Pt), gold (Au), iridium (Ir), and the like.

The substrate (including the first electrode 10 thereon) may be cleaned and subjected to UV ozone treatment. An organic solvent, e.g., isopropanol (IPA), acetone, and the like, may be used for the cleaning process.

The hole injection layer (HIL) 11 may be formed on the first electrode 10 of the cleaned substrate and may be formed using the conductive polymer composition of an embodiment. The hole injection layer (HIL) 11 may reduce contact resistance between the first electrode 10 and the light emission layer 12 and may also improve hole transfer capability of the first electrode 10 toward the light emission layer 12. Thus, driving voltage and life-span characteristics of the device may be generally improved.

The hole injection layer HIL 11 may be formed by dissolving the conductive polymer of an embodiment, and optionally a cross-linking agent, in a solvent to thereby prepare a composition for forming a hole injection layer (HIL), coating an upper part of the first electrode 10 with the prepared composition for forming a hole injection layer (HIL) through a spin-coating process, and drying the composition.

A thickness of the hole injection layer (HIL) 11 may be about 5 to about 200 nm. In an implementation, the thickness may be about 20 to about 100 nm. Maintaining the thickness of the hole injection layer (HIL) 11 within the range may help ensure that hole injection is sufficiently performed and that light transmission is maintained at a good level.

The light emission layer 12 may be formed on the hole injection layer (HIL) 11. A material for forming the light emission layer 12 is not specifically limited. Examples of the material may include an oxadiazole dimer dye (Bis-DAP-DXP)), spiro compounds (Spiro-DPVBi, Spiro-6P), triarylamine compounds, bis(styryl)amine (DPVBi, DSA), Flrpic, CzTT, anthracene, TPB, PPCP, DST, TPA, OXD-4, BBOT, and AZM-Zn (blue-emitting); coumarin 6, C545T, quinacridone, and Ir(ppy)3 (green-emitting); DCM1, DCM2, Eu(thenoyltrifluoroacetone)3 (Eu(TTA)3 and 1,1,7,7-tetramethyljulolidyl-9-enyl)-4H-pyran: DCJTB) (red-emitting), and the like. In an implementation, polymer light emitting materials may be used. The polymer light emitting materials may include polymers, e.g., phenylene-based, phenylene vinylene-based, thiophene-based, fluorine-based, and spiro-fluorene-based polymers or nitrogen-included aromatic compounds, but are not limited thereto.

A thickness of the emission layer 12 may be about 10 to about 500 nm. In an implementation, the thickness may be about 50 to about 120 nm. Maintaining the thickness of the emission layer 12 within the range may help ensure that leakage current amount and driving voltage increase re appropriately maintained, thereby effectively increasing life-span.

A dopant may be added to the composition for forming the light emission layer. An amount of the dopant included may vary according to the material used for forming the light emission layer. In an implementation, the dopant may be included in an amount of about 30 to about 80 parts by weight, with respect to 100 parts by weight of the material for forming a light emission layer (e.g., total weight of host and dopant). Maintaining the amount of the dopant within the range may help ensure that the light emitting characteristics of the EL device are effectively maintained. Examples of the dopant may include an arylamine, peryl-based compounds, pyrrole-based compounds, hydrazone-based compounds, carbazole-based compounds, stilbene-based compounds, starburst-based compounds, and oxadiazole-based compounds.

A hole transport layer (HTL) 16 may be selectively formed between the hole injection layer (HIL) 11 and the emission layer 12.

A material for forming the hole transport layer (HTL) is not specifically limited. In an implementation, the material may include at least one of compounds including a carbazole and/or an arylamine (which transport holes), phthalocyanine-based compounds, and triphenylene derivatives. In another implementation, the hole transport layer (HTL) material may include at least one of 1,3,5-tricarbazolylbenzene, 4,4'-bis-carbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine (TPD), N,N'-di(naphthalen-1-yl)-N,N'-diphenyl benzidine ($\alpha$-NPD), N,N'-diphenyl-N,N'-bis(1-naphthyl)-(1,1'-biphenyl)-4,4'-diamine (NPB), IDE320 (Idemitsu Kosan Co., Ltd.) poly(9,9-dioctylfluorene-co-N-(4-butylphenyl) diphenylamine) (TFB), and poly(9,9-dioctylfluorene-co-bis-N,N-phenyl-1,4-phenylenediamine) (PFB), but is not limited thereto.

The hole transport layer (HTL) 16 may have a thickness of about 1 to about 100 nm. In an implementation, the thickness may be about 5 to about 50 nm. Maintaining the thickness of the hole transport layer (HTL) 16 within the range may help ensure that the hole transport layer (HTL) 16 maintains sufficient hole transport capability and an appropriate level of driving voltage.

A hole blocking layer 13 and/or an electron transport layer (ETL) 15 may be formed on the light emission layer 12 through a deposition or spin coating method. The hole blocking layer 13 may prevent excitons (formed in a light emitting material) from transferring to the electron transport layer (ETL) 15 and/or may prevent holes from transferring to the electron transport layer (ETL) 15.

Examples of a material for forming the hole blocking layer 13 may include phenanthroline-based compounds (e.g., BCP of the UDC Company,), imidazole-based compounds, triaz-ole-based compounds, oxadiazole-based compounds (e.g., a commercial product PBD), an aluminium complex (UDC Company), BAlq, and the like.

The electron transport layer ETL 15 may include, e.g., oxazole-based compounds, iso-oxazole-based compounds, triazole-based compounds, isothiazole-based compounds, oxadiazole-based compounds, thiadiazole-based compounds, perylene-based compounds, aluminium complexes (Alq3 (tris(8-quinolinolato)-aluminium)), BAlq, SAlq, Almq3, gallium complexes (Gaq'2OPiv), Gaq'2OAc, 2(Gaq'2), and the like.

The hole blocking layer may have a thickness of about 5 nm to about 100 nm; and the electron transport layer (ETL) may have a thickness of about 5 nm to about 100 nm. Maintaining the thicknesses of the hole blocking layer and electron transport layer (ETL) within the ranges may help ensure sufficient electron transport or hole blocking performance.

The second electrode 14 may be formed on the stacked structure fabricated as described above; and the resulting material may be sealed to thereby complete the fabrication of an organic photoelectric device.

Materials for forming the second electrode 14 are not specifically limited. In an implementation, the materials may include metals with a small work function, e.g., Li, Cs, Ba, Ca, Ca/Al, LiF/Ca, LiF/Al, $BaF_2$/Ca, Mg, Ag, Al, or alloys thereof, or multi-layers thereof. A thickness of the second electrode 14 may be about 50 to about 3,000 Å

Hereinafter, in the following examples, when a graft copolymer including a conductive polymer that is chemically bound with a polyacid is applied, it may not be dedoped by heat generated in a device. In addition, the fluoric group may decrease the aggregation of the conductive polymer to thereby increase the storage stability and suppress the moisture absorption. Accordingly, efficiency and life-span characteristics of the organic photoelectric device may be improved. In the examples, the chemical formulas are not represented by precise chemical formulas, but they are illustrated as exemplary embodiments and have a random structure in a reaction for better understanding of this disclosure. Accordingly, the conductive polymer composition is illustrated as a random copolymer. A person having ordinary skills in this art can sufficiently understand parts of the present invention that are not specifically described.

SYNTHESIS EXAMPLE 1

Preparing Polymer A Precursor 12 g of sodium styrene sulfonate (SSNa) produced by the Sigma Aldrich Company (Chemical Formula 13-1), 3.4 g (corresponding to 30 mol % based on sodium styrene sulfonate (SSNa)) of pentafluorostyrene (Chemical Formula 15), and 0.83 g (corresponding to 5 mol % based on the total amount of two monomers) of 4-tert-butyloxycarbonylaminostyrene (Chemical Formula 14-1) were added to 100 ml of dimethylsulfoxide (DMSO) and heated to be completely dissolved.

0.3 g of azobisisobutyronitrile (AIBN) was dissolved in dimethylsulfoxide (DMSO) and added in a dropwise fashion to the obtained solution and then polymerized for more than 48 hours.

The obtained reactant was precipitated in acetone and allowed to stand at room temperature. The resultant precipitate was removed using a filter to provide poly(sodium styrene sulfonate-tert-butyloxy carbonylaminostyrene-pentafluorostyrene) copolymer {P(SSNa-BOCAmS-PFS)}. A mole ratio of Chemical Formula 13-1:Chemical Formula 14-1:Chemical Formula 15 was 15:1:5.

[Chemical Formula 13-1]

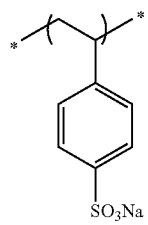

[Chemical Formula 14-1]

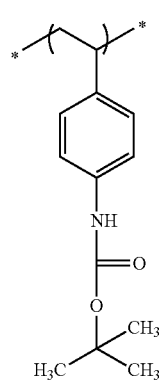

[Chemical Formula 15]

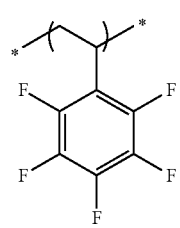

Preparing Polymer A

The obtained polymer A precursor was dissolved in 250 ml of 3N HCl aqueous solution and agitated for one hour or longer. Then, NaCl salt was sufficiently removed using a cationic resin of Amberite IR-120 and a Prep/ScaleTFF membrane manufactured by Millipore to provide a poly(sodium styrene sulfonate-ammonium styrene-pentafluoro styrene) copolymer {P(SSNa-AmS-PFS)} aqueous solution having a random repeat unit of the following Chemical Formula 13-2, Chemical Formula 14-2, and Chemical Formula 15. A mole ratio of Chemical Formula 13-2:Chemical Formula 14-2: Chemical Formula 15 was 15:1:5.

[Chemical Formula 13-2]

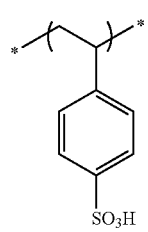

[Chemical Formula 14-2]

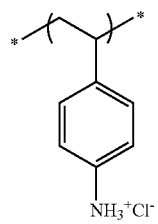

SYNTHESIS EXAMPLE 2

Preparing Polymer A' Precursor 12 g of sodium styrene sulfonate (SSNa) produced by the Sigma Aldrich Company, 2.3 g (corresponding to 20 mol % based on sodium styrene sulfonate (SSNa)) of pentafluoro styrene, and 0.61 g (corresponding to 4 mol % based on two monomers) of 4-tertbutyloxycarbonylaminostyrene were added to 250 ml of dimethylsulfoxide (DMSO) and heated to be completely dissolved.

0.3 g of azobisisobutyronitrile (AIBN) was dissolved in dimethylsulfoxide (DMSO) and added in a dropwise fashion to the obtained solution and then polymerized for more than 48 hours.

The obtained reactant was precipitated in acetone and allowed to stand at room temperature. The precipitate was removed using a filter to provide a poly(sodium styrene sulfonate-tertbutyloxycarbonyl amino styrene-pentafluorostyrene) copolymer {P(SSNa-BOCAmS-PFS)}. A mole ratio of Chemical Formula 13-1:Chemical Formula 14-1:Chemical Formula 15 was 20:1:4.

Preparing Polymer A'

The obtained polymer was dissolved in 250 ml of 3N HCl aqueous solution and agitated for one hour or longer. Then, NaCl salts were sufficiently removed using a cationic resin of Amberite IR-120 and a Prep/ScaleTFF membrane manufactured by Millipore to provide a poly(styrene sulfonic acid-ammonium styrene-pentafluorostyrene)copolymer {P(SSA-AmS-PFS)} aqueous solution having a random repeat unit of Chemical Formula 13-2, Chemical Formula 14-2, and Chemical Formula 15. A mole ratio of Chemical Formula 13-2:Chemical Formula 14-2:Chemical Formula 15 was 20:1:4.

SYNTHESIS EXAMPLE 3

Preparing Polymer A" Precursor 12 g of sodium styrene sulfonate (SSNa) produced by the Sigma Aldrich Company, 1.6 g (corresponding to 10 mol % based on sodium styrene sulfonate (SSNa)) of pentafluoro styrene, and 0.61 g (4 mol % based on two monomers) of 4-tert-butyloxy carbonylamino styrene were added to 100 ml of dimethyl sulfoxide (DMSO) and heated to be completely dissolved.

0.3 g of azobisisobutyronitrile (AIBN) was dissolved in dimethylsulfoxide (DMSO) and added in a dropwise fashion and then polymerized for more than 48 hours.

The obtained reactant was precipitated in acetone and allowed to stand at room temperature. The precipitate was removed using a filter to provide a poly(sodium styrene sulfonate-tertbutyloxy carbonyl amino styrene-pentafluoro styrene) copolymer {P(SSNa-BOCAmS-PFS)} aqueous solution. A mole ratio of Chemical Formula 13-1:Chemical Formula 14-1:Chemical Formula 15 was 24:1:3.

Preparing Polymer A"

The obtained polymer was dissolved in 250 ml of 3N HCl aqueous solution and agitated for one hour or longer. Then, NaCl salts were sufficiently removed using a cationic resin of Amberite IR-120 and a Prep/ScaleTFF membrane manufactured by Millipore to provide a poly(styrenesulfonic acid-ammonium styrene-pentafluoro styrene) copolymer {P(SSA-AmS-PFS)} aqueous solution having a random repeat unit. A mole ratio of Chemical Formula 13-2:Chemical Formula 14-2:Chemical Formula 15 was 24:1:3.

SYNTHESIS EXAMPLE 4

Preparing Polymer B Precursor 12 g of sodium styrene sulfonate (SSNa) (produced by the Sigma Aldrich Company) and 0.61 g of 4-tert-butyloxycarbonylaminostyrene were added to 100 ml of dimethylsulfoxide (DMSO) and heated to be completely dissolved.

0.3 g of azobisisobutyronitrile (AIBN) was dissolved in dimethylsulfoxide (DMSO) and added in a dropwise fashion and then polymerized for more than 48 hours.

The obtained reactant was precipitated in acetone and allowed to stand at room temperature. The precipitate was removed using a filter to provide a poly(sodium styrene sulfonate-tertbutyloxycarbonyl aminostyrene) copolymer {P(SSNa-BOCAmS)} aqueous solution. A mole ratio of Chemical Formula 13-1:Chemical Formula 14-1 was 19:1.

Preparing Polymer B

The obtained polymer was dissolved in 250 ml of 3N HCl aqueous solution and agitated for one hour or longer. Then, NaCl salts were sufficiently removed using a cationic resin of Amberite IR-120 and a Prep/ScaleTFF membrane manufactured by Millipore to provide a poly(styrene sulfonic acid-ammonium styrene) copolymer {P(SSA-AmS)} aqueous solution having a random repeating unit. A mole ratio of Chemical Formula 13-2:Chemical Formula 14-2 was 19:1.

SYNTHESIS EXAMPLE 5

Preparing Polymer C Precursor 12 g of sodium styrene sulfonate (SSNa) (produced by the Sigma Aldrich Company), 2.3 g (corresponding to 20 mol % based on sodium styrene sulfonate (SSNa)) of pentafluoro styrene, and 0.79 g (corresponding to 5 mol % based on two monomers) of 2-styrenyl(3,4-ethylenedioxy)pyrrole represented by the following Chemical Formula 16 were added into 250 ml of dimethyl sulfoxide (DMSO) and heated to be completely dissolved.

0.3 g of azobisisobutyronitrile (AIBN) was dissolved in dimethylsulfoxide (DMSO) and added in a dropwise fashion and then polymerized for more than 48 hours.

The obtained reactant was precipitated into acetone and allowed to stand at room temperature. The precipitate was removed using a filter to provide a poly(sodium styrene sulfonate-styrenyl (3,4-ethylenedioxy)pyrrole-pentafluoro styrene) copolymer {P(SSNa-StEDOP-PFS)}. A mole ratio of Chemical Formula 13-1:Chemical Formula 16:Chemical Formula 15 was 15:1:5.

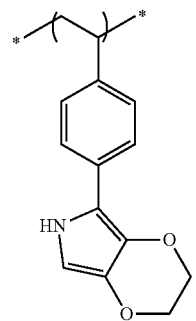

[Chemical Formula 16]

Preparing Polymer C

The obtained polymer was dissolved in 250 ml of 3N HCl aqueous solution and agitated for one hour or longer. Then, NaCl slats was sufficiently removed using a cationic resin of Amberite IR-120 and a Prep/ScaleTFF membrane manufactured by Millipore to provide a poly(styrenesulfonic acid-styrenyl (3,4-ethylenedioxy)pyrrole-pentafluorostyrene)copolymer {P(SSA-StEDOP-PFS)} aqueous solution having a random repeating unit represented by Chemical Formula 13-2, Chemical Formula 16, and Chemical Formula 15. A mole ratio of Chemical Formula 13-2:Chemical Formula 16:Chemical Formula 15 was 15:1:5.

SYNTHESIS EXAMPLE 6

Preparing Polymer D Precursor 12 g of sodium styrene sulfonate (SSNa) produced by the Sigma Aldrich Company, 2.3 g (corresponding to 20 mol % based on sodium styrene sulfonate (SSNa)) of pentafluorostyrene, and 0.85 g (corresponding to 5 mol % based on two monomers) of 2-styrenyl (3,4-ethylenedioxy)thiophene represented by the following Chemical Formula 17 were added to 250 ml of dimethylsulfoxide (DMSO) and heated to be completely dissolved.

0.3 g of azobisisobutyronitrile (AIBN) was dissolved in dimethylsulfoxide (DMSO) and added in a dropwise fashion and then polymerized for more than 48 hours.

The obtained reactant was precipitated in acetone and allowed to stand at room temperature. The precipitate was removed using a filter to provide a poly(sodium styrene sulfonate-styrenyl (3,4-ethylenedioxy)thiophene-pentafluorostyrene) copolymer {P(SSNa-StEDOT-PFS)}. A mole ratio of Chemical Formula 13-1:Chemical Formula 17:Chemical Formula 15 was 16:1:3.

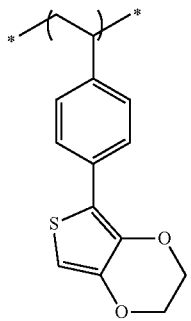

[Chemical Formula 17]

Preparing Polymer D

The obtained polymer was dissolved in 250 ml of 3N HCl aqueous solution and agitated for one hour or longer. Then, NaCl salts were sufficiently removed using a cationic resin of Amberite IR-120 and a Prep/ScaleTFF membrane manufactured by Millipore to provide a poly(styrenesulfonic acid-styrenyl (3,4-ethylenedioxy)thiophene-pentafluorostyrene) copolymer {P(SSA-StEDOT-PFS)} aqueous solution having a random repeating unit represented by Chemical Formula 13-2, Chemical Formula 17, and Chemical Formula 16. A mole ratio of Chemical Formula 13-2:Chemical Formula 17:Chemical Formula 16 was 15:1:3.

[Assessing Solubility of Polymer in Water]

The conductive polymer exhibited a different solubility in water depending upon the ratio of the hydrophobic monomer represented by Chemical Formula 15, the monomer chemical binding with polyacid represented by Chemical Formula 14-1, the monomer represented by Chemical Formula 13-1, and hydrophilic sodium styrenesulfonate. Accordingly, Synthesis Examples 1 to 6 having the amount ratio as shown in Table 1 were measured to determine the solubility. The synthesized conductive polymer was prepared to provide a 2 wt % aqueous solution, and the filtering level was analyzed using a 0.45 μm PVDF syringe filter having a diameter of 13 mm. For indicating the solubility, O is assigned to the case of filtering at 3 ml or more; X is assigned to the case of not filtering at 0.5 ml or more; and A is assigned to the case of filtering 0.5 ml or more and less than 3 ml. As shown in the following Table 1, all of Synthesis Examples 1 to 6 had excellent solubility.

self-doped conductive polymer. Resultant salts and side-product salts were purified in accordance with an ion exchange resin or dialysis.

[Chemical Formula 13]

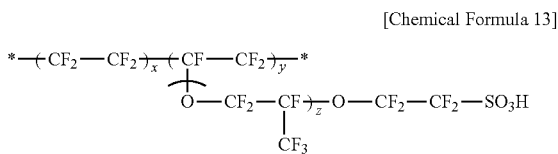

A conductive polymer composition was prepared using the aqueous solution including the obtained self-doped conductive polymer compound. The conductive polymer was added at 1.2 to 1.5 wt % (solid amount ratio).

EXAMPLE 2

A conductive polymer composition was prepared in accordance with the same procedure as in Example 1, except that the copolymer aqueous solution obtained from Synthesis Example 1 and NAFION were mixed in a ratio of 2:1 and polymerized instead of a ratio of 1:1.

EXAMPLE 3

A conductive polymer composition was prepared in accordance with the same procedure as in Example 1, except that the copolymer aqueous solution obtained from Synthesis

TABLE 1

| Sample | Chemical Formula 13-1 [mol %] | Chemical Formula 13-2 [mol %] | Chemical Formula 14-1 [mol %] | Chemical Formula 14-2 [mol %] | Chemical Formula 15 [mol %] | Chemical Formula 16 [mol %] | Chemical Formula 17 [mol %] | Solubility |
|---|---|---|---|---|---|---|---|---|
| Synthesis Example 1-precursor | 15 | — | 1 | — | 5 | — | — | O |
| Synthesis Example 1 | — | 15 | — | 1 | 5 | — | — | O |
| Synthesis Example 2-precursor | 20 | — | 1 | — | 4 | — | — | O |
| Synthesis Example 2 | — | 20 | — | 1 | 4 | — | — | O |
| Synthesis Example 3-precursor | 24 | — | 1 | — | 3 | — | — | O |
| Synthesis Example 3 | — | 24 | — | 1 | 3 | — | — | O |
| Synthesis Example 4-precursor | 19 | — | 1 | — | — | — | — | O |
| Synthesis Example 4 | — | 19 | — | 1 | — | — | — | O |
| Synthesis Example 5-precursor | 15 | — | — | — | 5 | 1 | — | O |
| Synthesis Example 5 | — | 15 | — | — | 5 | 1 | — | O |
| Synthesis Example 6-precursor | 16 | — | — | — | 3 | — | 1 | O |
| Synthesis Example 6 | — | 16 | — | — | 3 | — | 1 | O |

Preparing Self-doped Conductive Polymer Compound Solution

EXAMPLE 1

A copolymer aqueous solution (copolymer amount: 2 g) represented by Synthesis Example 1 and 10 wt % of ionomer aqueous solution of NAFION represented by the following Chemical Formula 13 were mixed at a ratio of 1:1 to provide a solution. Aniline was added in water to the solution in an amount of 14 wt % based on 4 g of solid NAFION and the copolymer, and was polymerized using an ammonium persulfate oxidizing agent at 0° C. for 12 hours to provide a Example 1 and NAFION were mixed in a ratio of 5:1 and polymerized instead of a ratio of 1:1.

EXAMPLE 4

A conductive polymer composition was prepared in accordance with the same procedure as in Example 1, except that the copolymer aqueous solution obtained from Synthesis Example 3 and NAFION were mixed in a ratio of 1:1 and polymerized instead of mixing the copolymer aqueous solution obtained from Synthesis Example 1 and NAFION in a ratio of 1:1 and polymerizing.

EXAMPLE 5

A conductive polymer composition was prepared in accordance with the same procedure as in Example 4, except that the copolymer aqueous solution obtained from Synthesis Example 3 and NAFION were mixed in a ratio of 2:1 and polymerized instead of a ratio of 1:1.

EXAMPLE 6

A conductive polymer composition was prepared in accordance with the same procedure as in Example 4, except that the copolymer aqueous solution obtained from Synthesis Example 3 and NAFION were mixed in a ratio of 5:1 and polymerized instead of a ratio of 1:1.

COMPARATIVE EXAMPLE 1

A conductive polymer composition was prepared in accordance with the same procedure as in Example 1, except that the copolymer aqueous solution obtained from Synthesis Example 4 and NAFION were mixed in a ratio of 1:1 and polymerized instead of mixing the copolymer aqueous solution obtained from Synthesis Example 1 and NAFION in a ratio of 1:1 and polymerizing.

COMPARATIVE EXAMPLE 2

A conductive polymer composition was prepared in accordance with the same procedure as in Comparative Example 1, except that the copolymer aqueous solution obtained from Synthesis Example 4 and NAFION were mixed in a ratio of 5:1 and polymerized instead of 1:1.

COMPARATIVE EXAMPLE 3

A conductive polymer composition was prepared in accordance with the same procedure as in Comparative Example 1, except that the copolymer aqueous solution obtained from Synthesis Example 4 and NAFION were blended in a ratio of 1:1 instead of mixing in a ratio of 1:1 and polymerizing.

COMPARATIVE EXAMPLE 4

A conductive polymer composition was prepared in accordance with the same procedure as in Comparative Example 3, except that the copolymer aqueous solution obtained from Synthesis Example 4 and NAFION were blended in a ratio of 1:1 instead of blending in a ratio of 1:1.

COMPARATIVE EXAMPLE 5

A conductive polymer composition was prepared in accordance with the same procedure as in Comparative Example 3, except that the copolymer aqueous solution obtained from Synthesis Example 4 and NAFION were blended in a ratio of 5:1 instead of blending in a ratio of 1:1.

[Assessing Solubility of Conductive Polymer Composition in Water]

In order to confirm the filtering property of the Examples and Comparative Examples, 5 ml of each was filtered using a 0.45 um PVDF syringe filter having a diameter of 13 mm to determine solubility. The results are shown in the following Table 2. For indicating the solubility, O is assigned to the case of filtering at 3 ml or more; X is assigned to the case of not filtering at 0.5 ml or more; and □ is assigned to the case of filtering at 0.5 ml or more and less than 3 ml.

[Assessing Roughness]

In order to assess the thin film characteristics of the examples and comparative examples, the surface roughness was measured using AFM equipment. The results are shown in the following Table 2.

TABLE 2

| Sample | Solubility | Roughness[nm] |
| --- | --- | --- |
| Example 1 | O | 1.8 |
| Example 2 | O | 1.5 |
| Example 3 | O | 1.0 |
| Example 4 | O | 2.0 |
| Example 5 | O | 0.9 |
| Example 6 | O | 1.0 |
| Comparative Example 1 | X | >10 |
| Comparative Example 2 | X | 4.7 |
| Comparative Example 3 | □ | 3.1 |
| Comparative Example 4 | O | 2.7 |
| Comparative Example 5 | O | 2.2 |

Referring to Table 2, the conductive polymer compositions according to the embodiments exhibited excellent solubility due to the hydrophobic group and decreased the aggregation of NAFION to compensate the surface roughness.

Fabrication of Organic Photoelectric Device

A 15Ψ/cm² 1200 ITO glass substrate (from the Corning Company) was cut in a size of width×length×thickness of 50 mm×50 mm×0.7 mm, rinsed using ultrasonic waves in isopropyl alcohol and deionized water for 5 minutes, and cleaned with ultraviolet rays and ozone for 30 minutes.

The above-prepared substrate was spin-coated with the conductive polymer compositions of Examples 1, 2, 3, 6, and Comparative Example 5 to thereby form a 300 nm-thick hole injection layer (HIL).

A 700 nm-thick light emission layer was formed of a green light emitting polymer in the upper part of the hole injection layer, and a second electrode of LiF at 2 nm and Al at 100 nm was formed on the light emission layer to thereby fabricate an organic photoelectric device.

[Luminous Efficiency Characteristics]

Luminous efficiency of the organic photoelectric device according to Examples 1, 2, 3, and 6, and Comparative Example 5 was measured using a SpectraScan PR650 spectroradiometer. The results are shown in the following Table 3.

TABLE 3

| Sample | Efficiency(1000 nit reference) (cd/A) | Max. efficiency(cd/A) | Driving voltage(@1000 nit) [Vd] |
| --- | --- | --- | --- |
| Example 1 | 7.5 | 11.6 | 5.2 |
| Example 2 | 8.7 | 10.7 | 5.0 |
| Example 3 | 7.0 | 9.5 | 5.1 |
| Example 6 | 6.4 | 7.0 | 5.0 |
| Comparative Example 5 | 3.1 | 2.1 | 5.5 |

Referring to Table 3, the organic photoelectric devices according to Examples 1 and 2 are good devices exhibiting excellent maximum luminous efficiency.

It is difficult to directly compare a device that is not yet optimized, but it may be seen that the organic photoelectric device obtained from Examples 1 and 2 increased the maximum luminous efficiency by 200% or more compared to that of Comparative Example 5.

By way of summation and review, to substantially increase luminance, an electron injection layer (EIL) or a hole injection layer should be included in an electrical light emitting assembly.

For example, Baytron-P, which is commercially available in the market and produced by the Bayer AG Company, is a organic compound that is capable of transferring charges, and it is soluble and is used to produce organic electro-luminescence (EL). Baytron-P is a kind of PEDOT (poly(3,4-ethylene dioxythiophene))-PSS (poly(4-styrene sulfonate)) aqueous solution.

PEDOT-PSS is widely used for fabrication of an organic light emitting diode. It may be used to form a hole injection layer (HIL) by spin-coating it on an indium tin oxide (ITO) electrode. The PEDOT-PSS has a structure as shown in the following Chemical Formula 18.

[Chemical Formula 13]

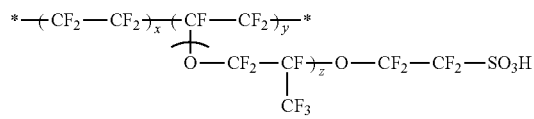

Such materials (shown in the above Chemical Formula 13) may have most of their carbon groups in the main chain and branched chain substituted with fluorine groups. Thus, the time that they are dispersed in water is short, and they may form colloid-type particles. When a conductive polymer is prepared by using these materials, the particles may severely agglomerate, even with a minute increase in the length of the repeating unit of the conductive polymer. Also, when they are used for forming a thin film through a spin coating process, the generated thin film may have poor uniformity.

[Chemical Formula 18]

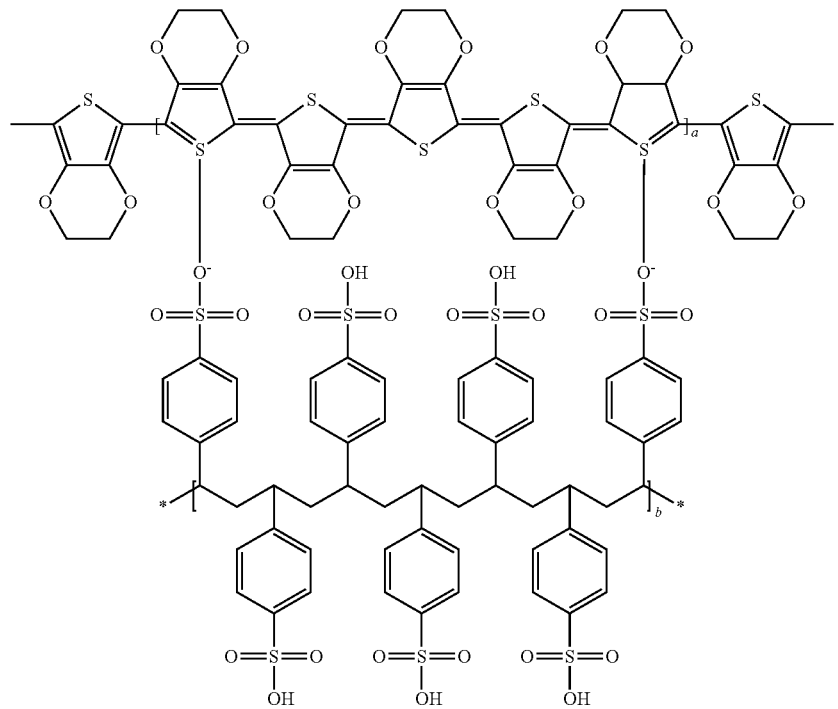

The PEDOT-PSS expressed in the above Chemical Formula 18 is a simple ion composite of a polyacid, which is poly(4-styrene sulfonate) (PSS), and a conductive polymer, which is poly(3,4-ethylenedioxythiophene) (PEDOT). It has a structure in which PEDOT is doped with a water-soluble polyacid.

However, when the hole injection layer (HIL) is formed using the PEDOT-PSS conductive polymer composition, the PSS may be deteriorated and dedoped due to its property of absorbing moisture, or a part of the PSS may be decomposed through a reaction with electrons to thereby emit a material such as a sulfate. The emitted material may be diffused into a neighboring organic layer, such as a light emission layer. The diffusion of a material originating from the hole injection layer (HIL) into the light emission layer causes exciton quenching to thereby decrease the efficiency and life-span of the organic light emitting diode.

A conductive polymer may be doped with an ionomer where both main chains and branched chains have substituted fluorine groups, e.g., in Chemical Formula 13.

The embodiments provide a self-doped conductive polymer in which the conductive polymer is chemically bound with a polyacid.

Another embodiment provides a conductive polymer composition having excellent thin film characteristics and storage stability by suppressing moisture absorption and decreasing intermolecular agglomeration.

Another embodiment provides an organic photoelectric device including the conductive polymer organic film to provide high efficiency and a long life-span.

According to one aspect of the present invention, the conductive polymer and polyacid may be prevented from being dedoped by heat generated in the organic photoelectric device and the agglomeration and moisture absorption of the conductive polymer may be suppressed because the conductive polymer may be chemically bound with the polyacid and doped with an ionomer. In addition, the conductive polymer composition may have a low moisture absorbing property because it may include a polymer ionomer having a large amount of a fluoric group, and may have excellent hole injection characteristics due to a dipole force of the fluoric group present on a surface of the thin film. Accordingly, it is possible to improve the efficiency and life-span characteristics of an organic photoelectric device.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A conductive polymer comprising repeating units represented by the following Chemical Formula 1, repeating units represented by the following Chemical Formula 2, and repeating units represented by the following Chemical Formula 3:

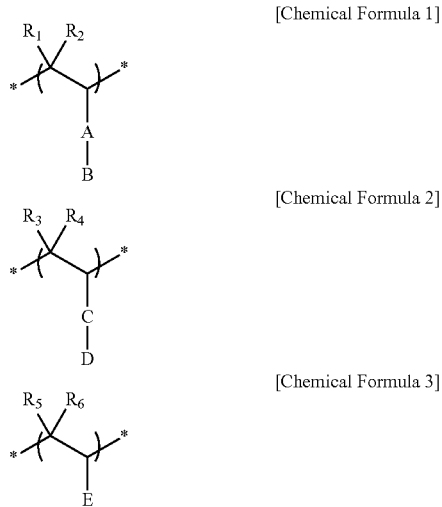

wherein in the above Chemical Formulae 1 to 3, $R_1$, $R_2$, $R_3$, $R_4$, $R_5$, and $R_6$ are each independently one of hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; a substituted or unsubstituted heteroarylester, and a halogen, A is one of a single bond; a substituted or unsubstituted alkylene; a substituted or unsubstituted heteroalkylene; a substituted or unsubstituted alkoxylene; a substituted or unsubstituted heteroalkoxylene; a substituted or unsubstituted arylene; a substituted or unsubstituted arylalkylene; a substituted or unsubstituted aryloxylene; a substituted or unsubstituted heteroarylene; a substituted or unsubstituted heteroarylalkylene; a substituted or unsubstituted heteroaryloxylene; a substituted or unsubstituted cycloalkylene; a substituted or unsubstituted heterocycloalkylene; a substituted or unsubstituted alkylene ester; a substituted or unsubstituted heteroalkylene ester; a substituted or unsubstituted arylene ester; and a substituted or unsubstituted heteroarylene ester, B is an ion-pair of a cation and an anion, the cation being selected from the group of $H^+$, a metal ion selected from the group of $Na^+$, $K^+$, $Li^+$, $Mg^{2+}$, $Zn^{2+}$, and $Al^{3+}$, $NR_3^+$ where R is H or a substituted or unsubstituted alkyl, and an organic ion of $CH_3(-CH_2-)_pO^+$ where p ranges from 1 to 50, and the anion being selected from the group of $PO_3^{2-}$, $SO_3^-$, $COO^-$, $I^-$, and $CH_3COO^-$, C is one of a single bond; —O—; —S—; —NH—; a substituted or unsubstituted alkylene; a substituted or unsubstituted heteroalkylene; a substituted or unsubstituted arylene; a substituted or unsubstituted oxyalkylene; a substituted or unsubstituted hetero-oxyalkylene; a substituted or unsubstituted arylalkylene; a substituted or unsubstituted aryloxylene; a substituted or unsubstituted aryleneamine; a substituted or unsubstituted pyrrolene; a substituted or unsubstituted thiophenylene; a substituted or unsubstituted heteroarylene; a substituted or unsubstituted heteroarylalkylene; a substituted or unsubstituted heteroaryloxylene; a substituted or unsubstituted cycloalkylene; a substituted or unsubstituted heterocycloalkylene; a substituted or unsubstituted alkylene ester; a substituted or unsubstituted heteroalkylene ester; a substituted or unsubstituted arylene ester; and a substituted or unsubstituted heteroarylene ester, D is one of a substituted or unsubstituted polyphenylene, a substituted or unsubstituted polyphenylenevinylene, a polyaniline or a derivative thereof represented by the following Chemical Formula 4, a polypyrrole or a derivative thereof represented by the following Chemical Formula 5, a substituted or unsubstituted polythiophene or a derivative thereof, and a polymer of a cyclic monomer represented by the following Chemical Formula 6, and E is a halogen-substituted carbon compound group that is unsubstituted or substituted with a heteroatom of nitrogen, phosphorus, sulfur, silicon, or oxygen, wherein:

a number average molecular weight Mn of the polyaniline or derivative thereof represented by the following Chemical Formula 4 is about 2,000 to about 100,000, and a weight average molecular weight Mw of the polyaniline or derivative thereof represented by the following Chemical Formula 4 is about 3,000 to about 200,000, a Mn of the polypyrrole or derivative thereof represented by the following Chemical Formula 5 is about 2,000 to about 100,000, and a Mw of the polypyrrole or a derivative thereof represented by the following Chemical Formula 5 is about 3,000 to about 200,000, and a Mn of the polymer of a cyclic monomer represented by the following Chemical Formula 6 is about 2,000 to about 100,000, and a Mw of the polymer of a cyclic monomer represented by the following Chemical Formula 6 is about 3,000 to about 200,000,

[Chemical Formula 4]

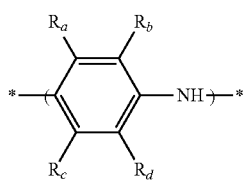

wherein in the above Chemical Formula 4, $R_a$, $R_b$, $R_c$, and $R_d$ are each independently one of hydrogen; a substituted or unsubstituted C1-C30 alkyl; a substituted or unsubstituted C1-C30 heteroalkyl; a substituted or unsubstituted C1-C30 alkoxy; a substituted or unsubstituted C1-C30 heteroalkoxy; a substituted or unsubstituted C6-C30 aryl; a substituted or unsubstituted C6-C30 arylalkyl; a substituted or unsubstituted C6-C30 aryloxy; a substituted or unsubstituted C6-C30 arylamine; a substituted or unsubstituted C6-C30 pyrrole; a substituted or unsubstituted C6-C30 thiophene; a substituted or unsubstituted C2-C30 heteroaryl; a substituted or unsubstituted C2-C30 heteroarylalkyl; a substituted or unsubstituted C2-C30 heteroaryloxy; a substituted or unsubstituted C5-C20 cycloalkyl; a substituted or unsubstituted C2-C30 heterocycloalkyl; a substituted or unsubstituted C2-C30 alkylester; a substituted or unsubstituted C1-C30 heteroalkylester; a substituted or unsubstituted C6-C30 arylester; and a substituted or unsubstituted C2-C30 heteroarylester,

[Chemical Formula 5]

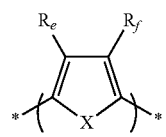

wherein in the above Chemical Formula 5,

X is one of —NH—, —NR—; —PH, —PR—; —O—; and —S—, where R is a C1-C20 alkyl or a C6-C20 aryl, and $R_e$ and $R_f$ are each independently one of —NH$_2$, —NRR'; —PH$_2$, —PRR'; —OH, —OR; —SH, —SR, wherein R and R' are each independently hydrogen, a C1-C20 alkyl, or a C6-C20 aryl; a C1-C30 alkyl; a C6-C30 aryl; a C1-C30 alkoxy; a C1-C30 heteroalkyl; a C1-C30 heteroalkoxy; a C6-C30 arylalkyl; a C6-C30 aryloxy; a C6-C30 arylamine; a C6-C30 pyrrole; a C6-C30 thiophene; a C2-C30 heteroaryl; a C2-C30 heteroarylalkyl; a C2-C30 heteroaryloxy; a C5-C20 cycloalkyl; a C2-C30 heterocycloalkyl; a C2-C30 alkylester; a C1-C30 heteroalkylester; a C6-C30 arylester; a C2-C30 heteroarylester, or a combination thereof,

[Chemical Formula 6]

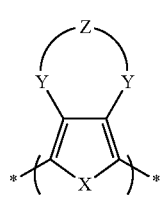

wherein in the above Chemical Formula 6,

X and Y are each independently one of —NH—, —NR—; —PH—, —PR—; —O—; and —S—, where R is a C1-C20 alkyl or a C6-C20 aryl, Z is —(CR$_1$R$_2$)$_x$—CR$_3$R$_4$—(CR$_5$R$_6$)$_y$— wherein R$_1$ to R$_6$ are each independently one of —H, a C1-C20 alkyl, a C6-C14 aryl, and —CH$_2$—ORi wherein Ri is —H, a C1-C6 alkyl acid group, a C2-C6 alkylester group, a C1-C6 heteroalkyl acid group, or a C1-C6 alkylsulfonic acid group, and x and y are each independently integers of 0 to 5, and wherein, in the above Chemical Formulae 4 to 6, one of the "*" is a portion bound with the C of Chemical Formula 2 and another "*" is —H or a substituted or unsubstituted C1-C30 alkyl.

2. The conductive polymer as claimed in claim 1, wherein R$_1$, R$_2$, R$_3$, R$_4$, R$_5$, and R$_6$ are each independently one of a substituted or unsubstituted C1-C30 alkyl; a substituted or unsubstituted C1-C30 heteroalkyl; a substituted or unsubstituted C1-C30 alkoxy; a substituted or unsubstituted C1-C30 heteroalkoxy; a substituted or unsubstituted C6-C30 aryl; a substituted or unsubstituted C6-C30 arylalkyl; a substituted or unsubstituted C6-C30 aryloxy; a substituted or unsubstituted C2-C30 heteroaryl; a substituted or unsubstituted C2-C30 heteroarylalkyl; a substituted or unsubstituted C2-C30 heteroaryloxy; a substituted or unsubstituted C5-C20 cycloalkyl; a substituted or unsubstituted C2-C30 heterocycloalkyl; a substituted or unsubstituted C2-C30 alkylester; a substituted or unsubstituted C1-C30 heteroalkylester; a substituted or unsubstituted C6-C30 arylester; and a substituted or unsubstituted C2-C30 heteroarylester, A is one of a substituted or unsubstituted C1-C30 alkylene; a substituted or unsubstituted C1-C30 heteroalkylene; a substituted or unsubstituted C1-C30 alkoxylene; a substituted or unsubstituted C1-C30 heteroalkoxylene; a substituted or unsubstituted C6-C30 arylene; a substituted or unsubstituted C6-C30 arylalkylene; a substituted or unsubstituted C6-C30 aryloxylene; a substituted or unsubstituted C2-C30 heteroarylene; a substituted or unsubstituted C2-C30 heteroarylalkylene; a substituted or unsubstituted C2-C30 heteroaryloxylene; a substituted or unsubstituted C5-C20 cycloalkylene; a substituted or unsubstituted C2-C30 heterocycloalkylene; a substituted or unsubstituted C2-C30 alkylene ester; a substituted or unsubstituted C1-C30 heteroalkylene ester; a substituted or unsubstituted C6-C30 arylene ester; and a substituted or unsubstituted C2-C30 heteroarylene ester, and E is a halogen-substituted C2-C30 carbon compound group that is unsubstituted or substituted with a heteroatom of nitrogen, phosphorus, sulfur, silicon, or oxygen.

3. A conductive polymer composition, comprising a solvent; and a conductive polymer represented by the following Chemical Formula 12:

[Chemical Formula 12]

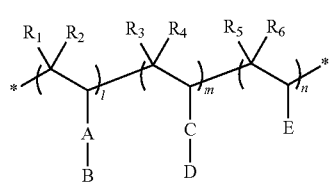

wherein in the above Chemical Formula 12, $R_1$, $R_2$, $R_3$, $R_4$, $R_5$, and $R_6$ are each independently one of hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; a substituted or unsubstituted heteroarylester, and a halogen, A is one of a single bond; a substituted or unsubstituted alkylene; a substituted or unsubstituted heteroalkylene; a substituted or unsubstituted alkoxylene; a substituted or unsubstituted heteroalkoxylene; a substituted or unsubstituted arylene; a substituted or unsubstituted arylalkylene; a substituted or unsubstituted aryloxylene; a substituted or unsubstituted heteroarylene; a substituted or unsubstituted heteroarylalkylene; a substituted or unsubstituted heteroaryloxylene; a substituted or unsubstituted cycloalkylene; a substituted or unsubstituted heterocycloalkylene; a substituted or unsubstituted alkylene ester; a substituted or unsubstituted heteroalkylene ester; a substituted or unsubstituted arylene ester; and a substituted or unsubstituted heteroarylene ester, B is an ion-pair of a cation and an anion, the cation being selected from the group of $H^+$, a metal ion selected from the group of $Na^+$, $K^+$, $Li^+$, $Mg^{2+}$, $Zn^{2+}$, and $Al^{3+}$, $NR_3^+$ where R is H or a substituted or unsubstituted alkyl, and an organic ion of $CH_3(-CH_2-)_pO^+$ where p ranges from 1 to 50, and the anion being selected from the group of $PO_3^{2-}$, $SO_3^-$, $COO^-$, $I^-$, and $CH_3COO^-$, C is one of a single bond; —O—; —S—; —NH—; a substituted or unsubstituted alkylene; a substituted or unsubstituted heteroalkylene; a substituted or unsubstituted arylene; a substituted or unsubstituted oxyalkylene; a substituted or unsubstituted hetero-oxyalkylene; a substituted or unsubstituted arylalkylene; a substituted or unsubstituted aryloxylene; a substituted or unsubstituted aryleneamine; a substituted or unsubstituted pyrrolene; a substituted or unsubstituted thiophenylene; a substituted or unsubstituted heteroarylene; a substituted or unsubstituted heteroarylalkylene; a substituted or unsubstituted heteroaryloxylene; a substituted or unsubstituted cycloalkylene; a substituted or unsubstituted heterocycloalkylene; a substituted or unsubstituted alkylene ester; a substituted or unsubstituted heteroalkylene ester; a substituted or unsubstituted arylene ester; and a substituted or unsubstituted heteroarylene ester, D is one of a substituted or unsubstituted polyphenylene, a substituted or unsubstituted polyphenylenevinylene, a polyaniline or a derivative thereof represented by the following Chemical Formula 4, a polypyrrole or a derivative thereof represented by the following Chemical Formula 5, a substituted or unsubstituted polythiophene or a derivative thereof, and a polymer of a cyclic monomer represented by the following Chemical Formula 6, E is a halogen-substituted carbon compound group that is unsubstituted or substituted with a heteroatom of nitrogen, phosphorus, sulfur, silicon, or oxygen, and $5 \le l \le 1,000,000$, $0.0001 \le m/l \le 0.2$, $0.0001 \le n/l \le 1$, and $0.00000001 \le m+n/l \le 1.1$, wherein:

a number average molecular weight Mn of the polyaniline or derivative thereof represented by the following Chemical Formula 4 is about 2,000 to about 100,000, and a weight average molecular weight Mw of the polyaniline or derivative thereof represented by the following Chemical Formula 4 is about 3,000 to about 200,000, a Mn of the polypyrrole or derivative thereof represented by the following Chemical Formula 5 is about 2,000 to about 100,000, and a Mw of the polypyrrole or a derivative thereof represented by the following Chemical Formula 5 is about 3,000 to about 200,000, and a Mn of the polymer of a cyclic monomer represented by the following Chemical Formula 6 is about 2,000 to about 100,000, and a Mw of the polymer of a cyclic monomer represented by the following Chemical Formula 6 is about 3,000 to about 200,000,

[Chemical Formula 4]

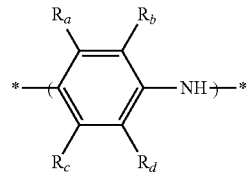

wherein in the above Chemical Formula 4, $R_a$, $R_b$, $R_c$, and $R_d$ are each independently one of hydrogen; a substituted or unsubstituted C1-C30 alkyl; a substituted or unsubstituted C1-C30 heteroalkyl; a substituted or unsubstituted C1-C30 alkoxy; a substituted or unsubstituted C1-C30 heteroalkoxy; a substituted or unsubstituted C6-C30 aryl; a substituted or unsubstituted C6-C30 arylalkyl; a substituted or unsubstituted C6-C30 aryloxy; a substituted or unsubstituted C6-C30 arylamine; a substituted or unsubstituted C6-C30 pyrrole; a substituted or unsubstituted C6-C30 thiophene; a substituted or unsubstituted C2-C30 heteroaryl; a substituted or unsubstituted C2-C30 heteroarylalkyl; a substituted or unsubstituted C2-C30 heteroaryloxy; a substituted or unsubstituted C5-C20 cycloalkyl; a substituted or unsubstituted C2-C30 heterocycloalkyl; a substituted or unsubstituted C2-C30 alkylester; a substituted or unsubstituted C1-C30 heteroalkylester; a substituted or unsubstituted C6-C30 arylester; and a substituted or unsubstituted C2-C30 heteroarylester,

[Chemical Formula 5]

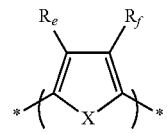

wherein in the above Chemical Formula 5,

X is one of —NH—, —NR—; —PH, —PR—; —O—; and —S—, where R is a C1-C20 alkyl or a C6-C20 aryl, and $R_e$ and $R_f$ are each independently one of —$NH_2$, —NRR'; —$PH_2$, —PRR'; —OH, —OR; —SH, —SR, wherein R and R' are each independently hydrogen, a C1-C20 alkyl, or a C6-C20 aryl; a C1-C30 alkyl; a C6-C30 aryl; a C1-C30 alkoxy; a C1-C30 heteroalkyl; a C1-C30 heteroalkoxy; a C6-C30 arylalkyl; a C6-C30 aryloxy; a C6-C30 arylamine; a C6-C30 pyrrole; a C6-C30 thiophene; a C2-C30 heteroaryl; a C2-C30 heteroarylalkyl; a C2-C30 heteroaryloxy; a C5-C20 cycloalkyl; a C2-C30 heterocycloalkyl; a C2-C30 alkylester; a C1-C30 heteroalkylester; a C6-C30 arylester; a C2-C30 heteroarylester, or a combination thereof,

[Chemical Formula 6]

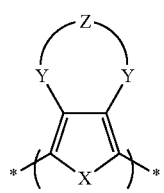

wherein in the above Chemical Formula 6,

X and Y are each independently one of —NH—, —NR—; —PH—, —PR—; —O—; and —S—, where R is a C1-C20 alkyl or a C6-C20 aryl, Z is —$(CR_1R_2)_x$—$CR_3R_4$—$(CR_5R_6)_y$— wherein $R_1$ to $R_6$ are each independently one of —H, a C1-C20 alkyl, a C6-C14 aryl, and —$CH_2$—ORi wherein Ri is —H, a C1-C6 alkyl acid group, a C2-C6 alkylester group, a C1-C6 heteroalkyl acid group, or a C1-C6 alkylsulfonic acid group, and x and y are each independently integers of 0 to 5 and wherein, in the above Chemical Formulae 4 to 6, one of the "*"is a portion bound with the C of Chemical Formula 2 and another "*" is —H or a substituted or unsubstituted C1-C30 alkyl.

4. The conductive polymer composition as claimed in claim 3, wherein $R_1$, $R_2$, $R_3$, $R_4$, $R_5$, and $R_6$ are each independently one of a substituted or unsubstituted C1-C30 alkyl; a substituted or unsubstituted C1-C30 heteroalkyl; a substituted or unsubstituted C1-C30 alkoxy; a substituted or unsubstituted C1-C30 heteroalkoxy; a substituted or unsubstituted C6-C30 aryl; a substituted or unsubstituted C6-C30 arylalkyl; a substituted or unsubstituted C6-C30 aryloxy; a substituted or unsubstituted C2-C30 heteroaryl; a substituted or unsubstituted C2-C30 heteroarylalkyl; a substituted or unsubstituted C2-C30 heteroaryloxy; a substituted or unsubstituted C5-C20 cycloalkyl; a substituted or unsubstituted C2-C30 heterocycloalkyl; a substituted or unsubstituted C2-C30 alkylester; a substituted or unsubstituted C1-C30 heteroalkylester; a substituted or unsubstituted C6-C30 arylester; and a substituted or unsubstituted C2-C30 heteroarylester, A is one of a substituted or unsubstituted C1-C30 alkylene; a substituted or unsubstituted C1-C30 heteroalkylene; a substituted or unsubstituted C1-C30 alkoxylene; a substituted or unsubstituted C1-C30 heteroalkoxylene; a substituted or unsubstituted C6-C30 arylene; a substituted or unsubstituted C6-C30 arylalkylene; a substituted or unsubstituted C6-C30 aryloxylene; a substituted or unsubstituted C2-C30 heteroarylene; a substituted or unsubstituted C2-C30 heteroarylalkylene; a substituted or unsubstituted C2-C30 heteroaryloxylene; a substituted or unsubstituted C5-C20 cycloalkylene; a substituted or unsubstituted C2-C30 heterocycloalkylene; a substituted or unsubstituted C2-C30 alkylene ester; a substituted or unsubstituted C1-C30 heteroalkylene ester; a substituted or unsubstituted C6-C30 arylene ester; and a substituted or unsubstituted C2-C30 heteroarylene ester, and E is a halogen-substituted C2-C30 carbon compound group that is unsubstituted or substituted with a heteroatom of nitrogen, phosphorus, sulfur, silicon, or oxygen.

5. The conductive polymer composition as claimed in claim 3, wherein the conductive polymer further includes a repeating unit represented by at least one of the following Chemical Formulae 7 to 11:

[Chemical Formula 7]

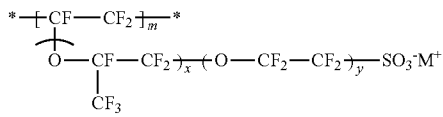

wherein in the above Chemical Formula 7

$M^+$ is one of $H^+$; an alkali metal cation; an alkaline-earth metal cation; and an ammonium ion, the ammonium ion including $NH^+R_1R_2R_3$, $R_1$ to $R_3$ are each independently one of hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; a substituted or unsubstituted heteroarylester; and a halogen, 0<m<1,000,000, and x and y are each independently integers of 0 to about 20,

[Chemical Formula 8]

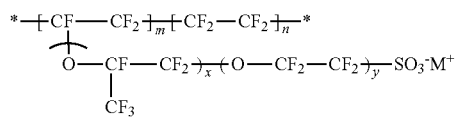

[Chemical Formula 9]

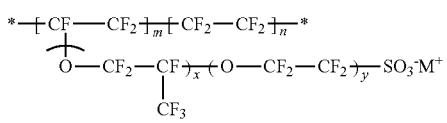

wherein in the above Chemical Formulae 8 and 9, $M^+$, m, x and y are the same as in the above Chemical Formula 7, and 0<n<1,000,000,

[Chemical Formula 10]

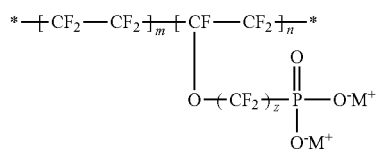

wherein in the above Chemical Formula 10,

M+, m, and n are the same as in the above Chemical Formula 8, and z is an integer of 0 to about 20,

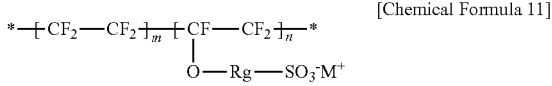
[Chemical Formula 11]

wherein in the above Chemical Formula 11,

M+, m, n are the same as in the above Chemical Formula 8, and $R_g$ includes 1% or more of a fluorine substituent based on total hydrogen and includes one of a substituted or unsubstituted C1-C30 alkylene; a substituted or unsubstituted C1-C30 heteroalkylene; a substituted or unsubstituted C6-C30 arylene; a substituted or unsubstituted C6-C30 arylalkylene; a substituted or unsubstituted C2-C30 heteroarylene; a substituted or unsubstituted C2-C30 heteroarylalkylene; a substituted or unsubstituted C5-C20 cycloalkylene; and a substituted or unsubstituted C2-C30 heterocycloalkylene.

6. The conductive polymer composition as claimed in claim 3, wherein the solvent includes water, alcohol, dimethyl formamide (DMF), dimethylsulfoxide, toluene, xylene, chlorobenzene, or a combination thereof.

7. The conductive polymer composition as claimed in claim 3, further comprising a cross-linking agent.

8. The conductive polymer composition as claimed in claim 7, wherein the cross-linking agent includes a hydroxyl-containing physical cross-linking agent, a hydroxyl-containing chemical cross-linking agent, or a mixture thereof.

9. The conductive polymer composition as claimed in claim 7, wherein the cross-linking agent includes a physical cross-linking agent, the physical cross-linking agent including glycerol, butanol, polyvinyl alcohol, polyethyleneglycol, polyethyleneimine, polyvinylpyrrolidone, or a mixture thereof.

10. The conductive polymer composition as claimed in claim 9, wherein the physical cross-linking agent is included in an amount of about 0.001 to about 5 parts by weight with respect to 100 parts by weight of the conductive polymer.

11. The conductive polymer composition as claimed in claim 7, wherein the cross-linking agent includes a chemical cross-linking agent, the chemical cross-linking agent including tetraethyloxysilane, polyaziridine, a melamine-based polymer, an epoxy-based polymer, or a combination thereof.

12. The conductive polymer composition as claimed in claim 11, wherein the chemical cross-linking agent is included in an amount of about 0.001 to about 50 parts by weight, with respect to 100 parts by weight of the conductive polymer.

13. The conductive polymer composition as claimed in claim 3, further comprising an organic salt.

14. The conductive polymer composition as claimed in claim 13, wherein the organic salt includes one of imidazolium salt, thiazolium salt, pyridinium salt, pyrrolidinium salt, and piperidinium salt.

15. The conductive polymer composition as claimed in claim 13, wherein the organic salt is included in an amount of about 0.1 to about 10 parts by weight, with respect to 100 parts by weight of the conductive polymer.

16. A conductive polymer organic film made using the conductive polymer composition as claimed in claim 3.

17. An organic photoelectric device comprising the conductive polymer organic film as claimed in claim 16.

18. The organic photoelectric device as claimed in claim 17, wherein the organic photoelectric device is an organic light emitting diode.

19. The organic photoelectric device as claimed in claim 17, wherein the conductive polymer organic film is a hole or electron injection layer.

* * * * *